(12) United States Patent
Ohara et al.

(10) Patent No.: US 11,171,198 B2
(45) Date of Patent: Nov. 9, 2021

(54) DISPLAY DEVICE HAVING FLEXIBILITY

(71) Applicant: Japan Display Inc., Tokyo (JP)

(72) Inventors: Hiroki Ohara, Tokyo (JP); Satoshi Maruyama, Tokyo (JP)

(73) Assignee: Japan Display Inc., Tokyo (JP)

( * ) Notice: Subject to any disclaimer, the term of this patent is extended or adjusted under 35 U.S.C. 154(b) by 31 days.

(21) Appl. No.: 16/728,104

(22) Filed: Dec. 27, 2019

(65) Prior Publication Data

US 2020/0144353 A1  May 7, 2020

Related U.S. Application Data

(63) Continuation of application No. PCT/JP2018/015504, filed on Apr. 13, 2018.

(30) Foreign Application Priority Data

Jul. 12, 2017  (JP) .............................. JP2017-136031

(51) Int. Cl.
*H01L 27/32* (2006.01)
*G02F 1/1362* (2006.01)
(Continued)

(52) U.S. Cl.
CPC .... *H01L 27/3276* (2013.01); *G02F 1/136286* (2013.01); *H01L 27/3258* (2013.01); *G06F 1/1652* (2013.01); *H01L 51/0097* (2013.01)

(58) Field of Classification Search
CPC ............. H01L 27/3276; H01L 27/3258; H01L 51/0097; G02F 1/136286; G06F 1/1652
See application file for complete search history.

(56) References Cited

U.S. PATENT DOCUMENTS

2006/0215377 A1* 9/2006 Nomura ............... H05K 1/0281
                                                      361/748
2012/0146886 A1   6/2012 Minami et al.
(Continued)

FOREIGN PATENT DOCUMENTS

JP      2012-128006 A    7/2012
JP      2014-197181 A   10/2014
(Continued)

OTHER PUBLICATIONS

International Search Report dated Jun. 26, 2018 for the International application No. PCT/JP2018/015504, with English translation.
(Continued)

*Primary Examiner* — Lex H Malsawma
(74) *Attorney, Agent, or Firm* — Michael Best & Friedrich LLP

(57) ABSTRACT

Disclosed is a display device including: a first conductive film over and in contact with a substrate; a first undercoat and a second undercoat over and in contact with the first conductive film; a pixel over the first undercoat; a wiring over the first undercoat, the first conductive film, and the second undercoat and in contact with the first conductive film between the first undercoat and the second undercoat. The first undercoat and the second undercoat are spaced from each other over the first conductive film and each cover a part of the first conductive film. The wiring is configured to form a terminal to which a signal for driving the pixel is input over the second undercoat.

18 Claims, 20 Drawing Sheets

(51) Int. Cl.
 *G06F 1/16* (2006.01)
 *H01L 51/00* (2006.01)

(56) References Cited

U.S. PATENT DOCUMENTS

| | | |
|---|---|---|
| 2014/0217397 A1 | 8/2014 | Kwak et al. |
| 2014/0254111 A1 | 9/2014 | Yamazaki et al. |
| 2014/0353670 A1* | 12/2014 | Youn .................. H01L 51/0097 257/72 |
| 2016/0209719 A1 | 7/2016 | Yamaguchi et al. |
| 2016/0268546 A1 | 9/2016 | Lee |
| 2017/0148859 A1 | 5/2017 | Nishinohara |
| 2017/0170206 A1* | 6/2017 | Lee .................. H01L 29/78633 |

FOREIGN PATENT DOCUMENTS

| | | |
|---|---|---|
| JP | 2014-232300 A | 12/2014 |
| JP | 2016-134388 A | 7/2016 |
| JP | 2016-173461 A | 9/2016 |
| JP | 2017-098020 A | 6/2017 |
| JP | 2017-108065 A | 6/2017 |
| JP | 2017-111435 A | 6/2017 |
| WO | 2014/126403 A1 | 8/2014 |

OTHER PUBLICATIONS

Written Opinion of the International Searching Authority dated Jun. 26, 2018 for the International application No. PCT/JP2018/015504.

* cited by examiner

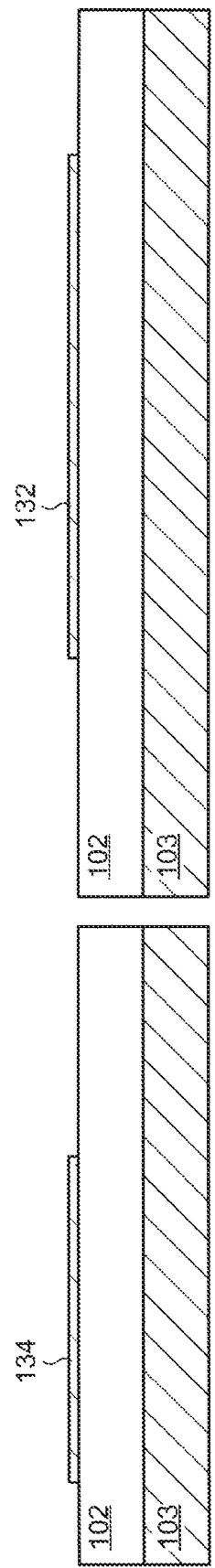
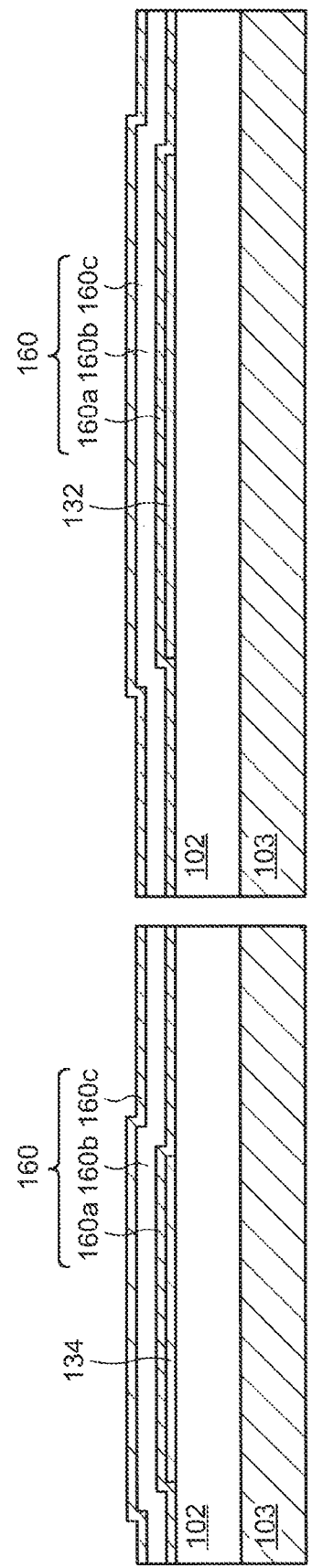
FIG. 6A
FIG. 6B

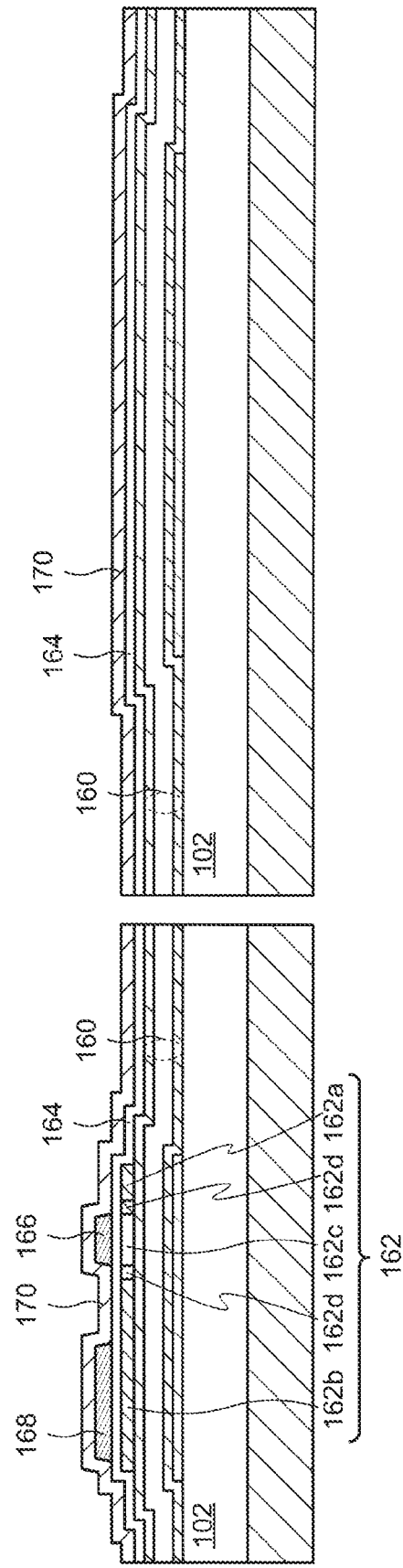
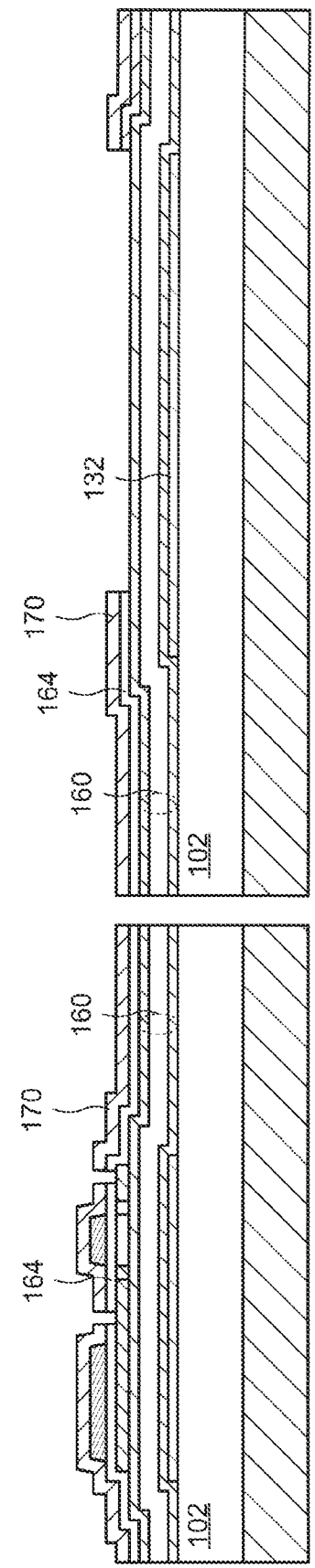
FIG.8A
FIG.8B

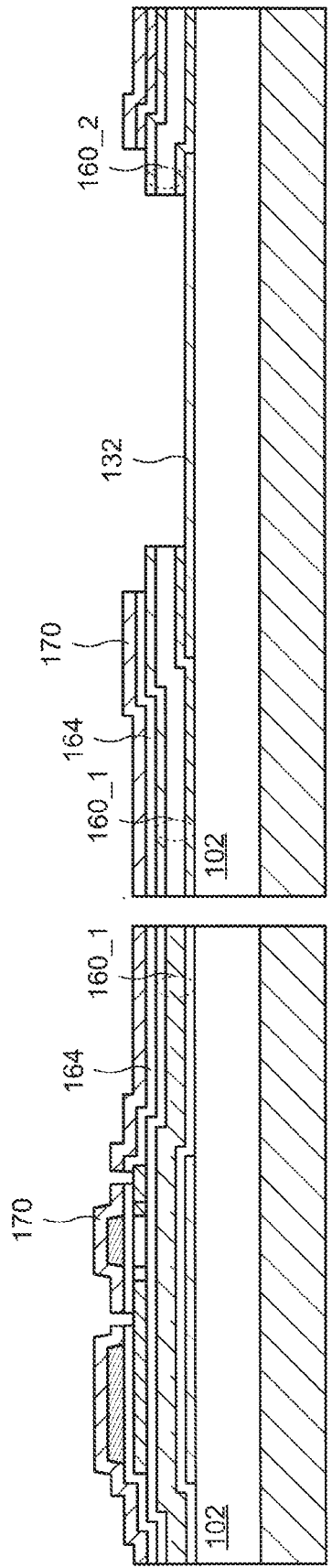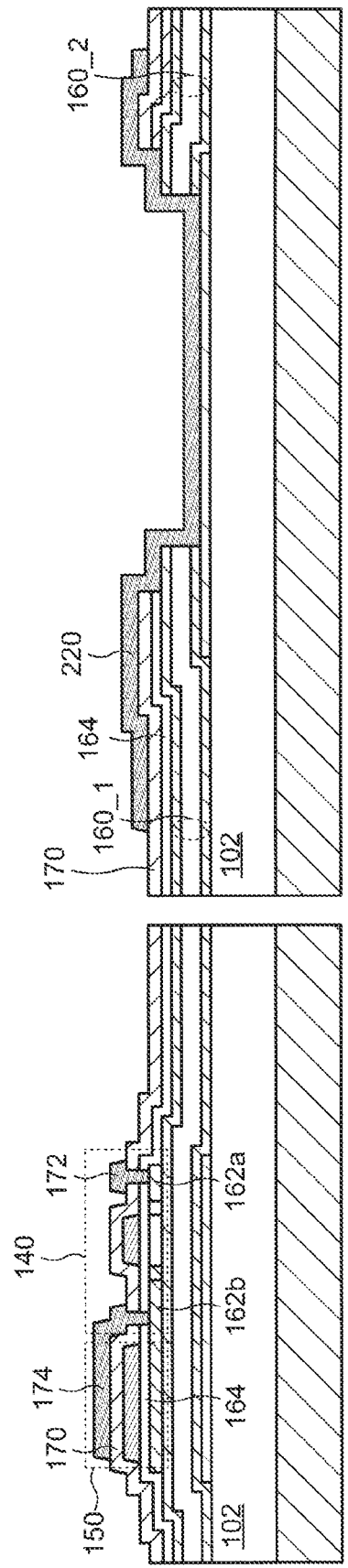

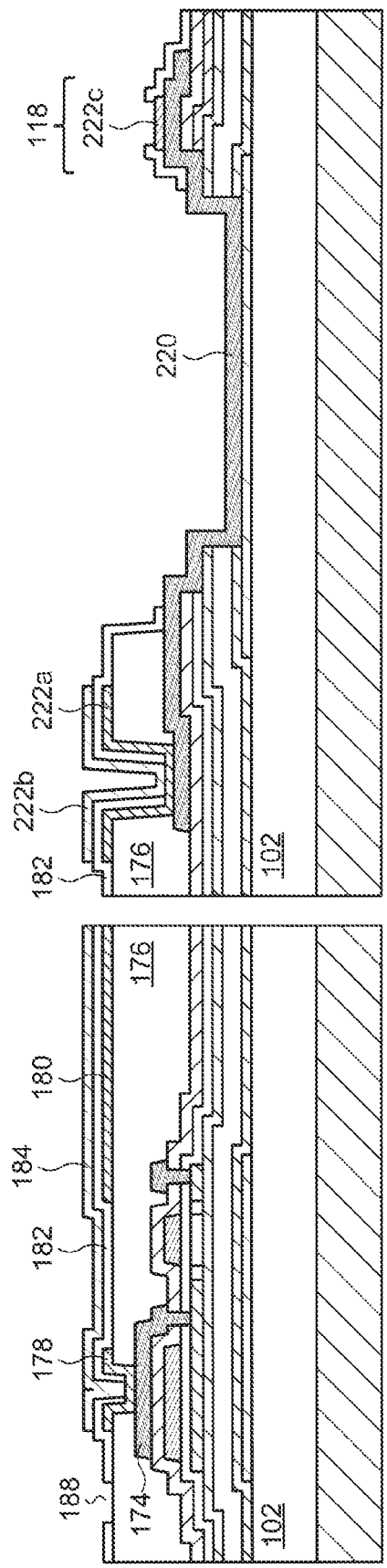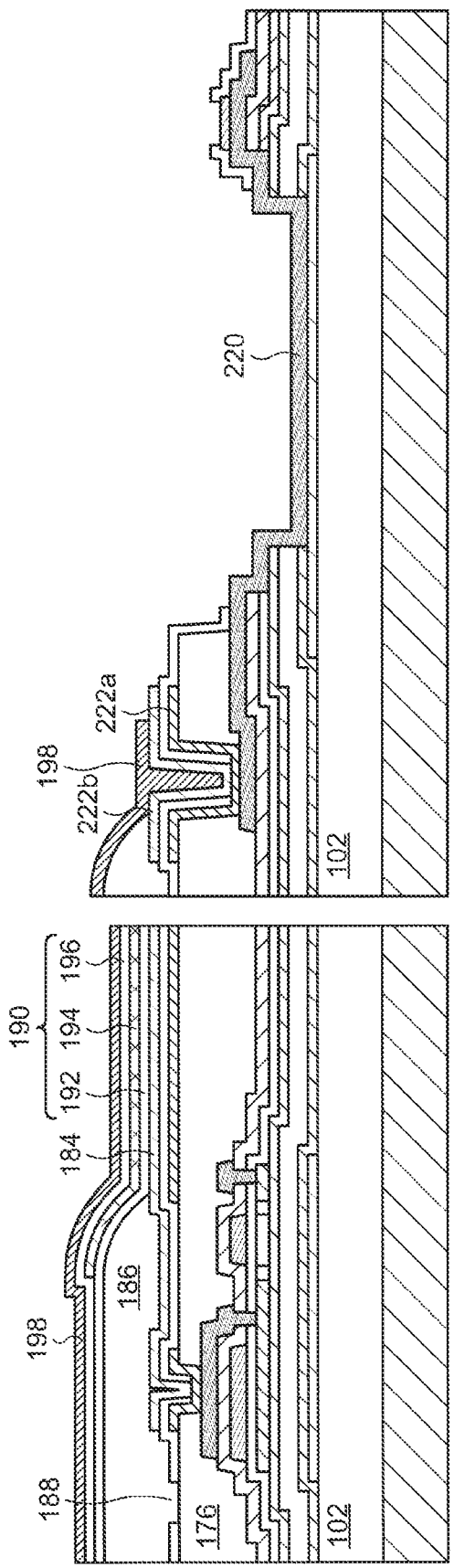

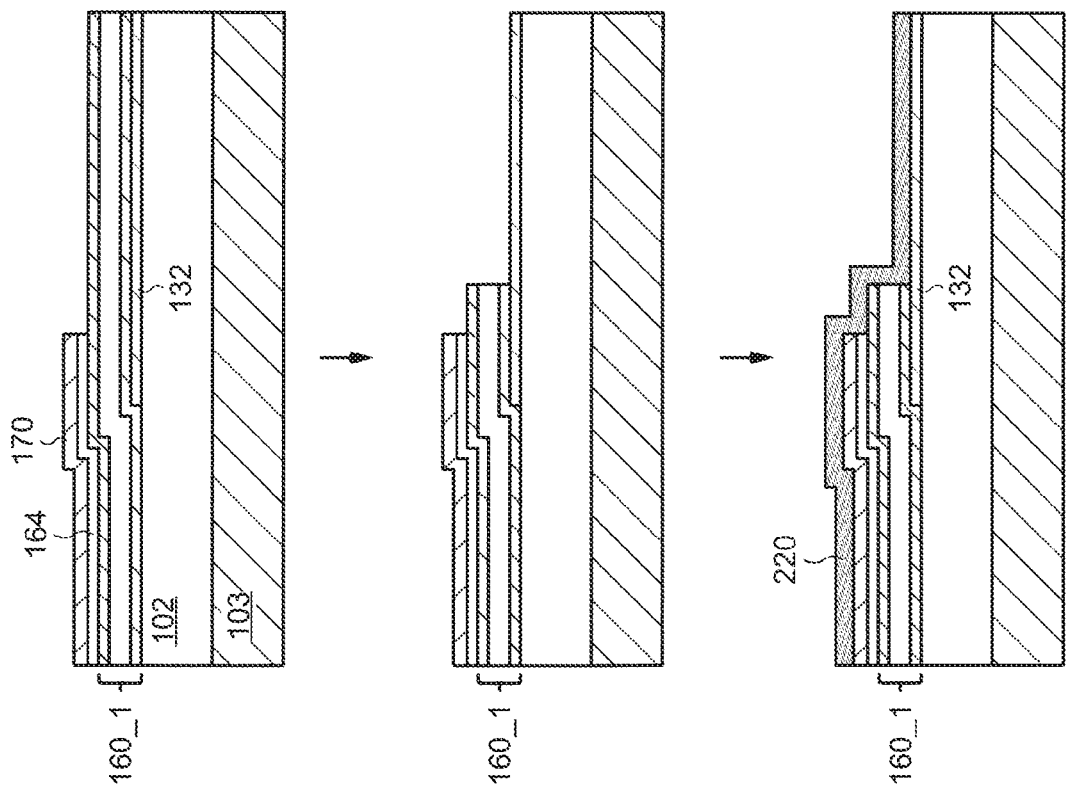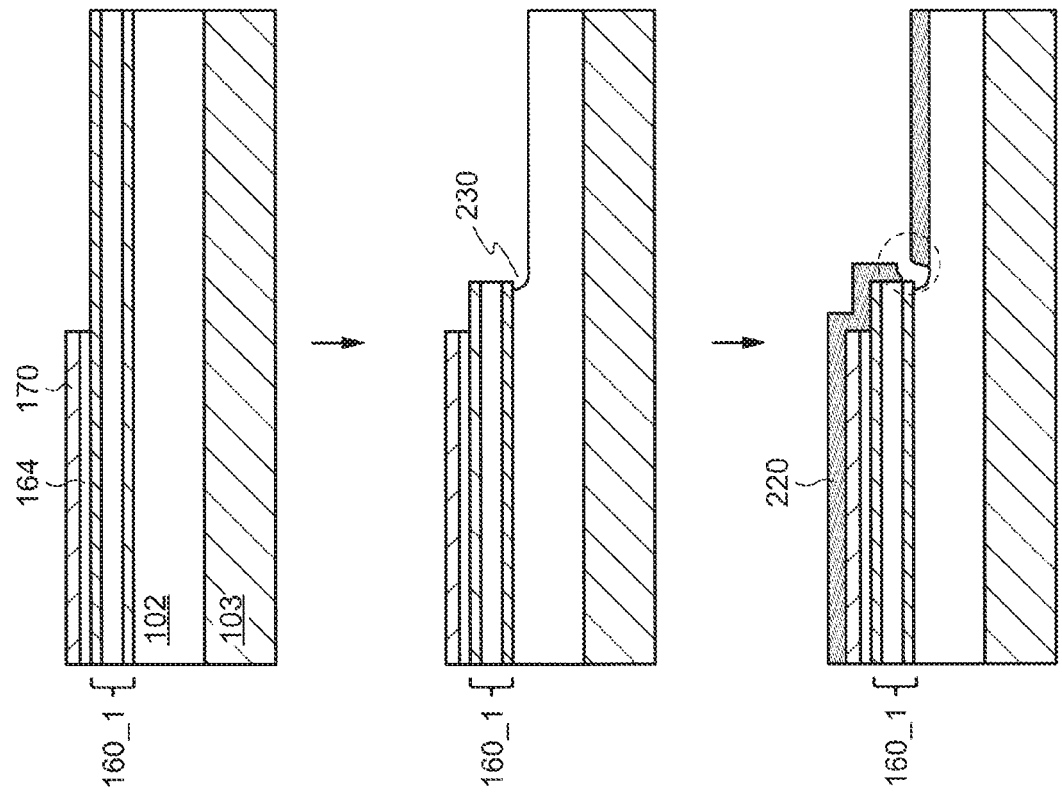

DISPLAY DEVICE HAVING FLEXIBILITY

This application is based upon and claims the benefit of priority from the prior Japanese Patent Application No. 2017-136031, filed on Jul. 12, 2017, and a PCT Application No. PCT/JP2018/015504, filed on Apr. 13, 2018, the entire contents of which are incorporated herein by reference.

FIELD

An embodiment of the present invention relates to a display device and a manufacturing method thereof. For example, an embodiment of the present invention relates to a display device having a light-emitting element and a manufacturing method thereof.

BACKGROUND

A liquid crystal display device and an organic EL (Electroluminescence) display device are represented as an example of display devices. These display devices possess a liquid crystal element or an organic light-emitting element (hereinafter, referred to as a light-emitting element) as a display element in each of a plurality of pixels formed over a substrate. A liquid crystal element and a light-emitting element respectively have a layer including a compound exhibiting liquid crystallinity and a layer (hereinafter referred to as an electroluminescence layer or an EL layer) including an emissive organic compound between a pair of electrodes (cathode and anode) and are driven by applying a voltage or supplying a current between the electrodes.

Use of a substrate with flexibility as the substrate provides flexibility to the whole of the display device, which enables production of a display device having a bent shape or a display device which can be freely deformed by a user. When a display device is bent, it is possible to reduce an apparent area of a frame and supply a display device with excellent designability by folding a substrate so that the portion (frame) which does not contribute to display overlaps with a display region (see Japanese Patent Application Publication No. 2012-128006).

SUMMARY

An embodiment of the present invention is a display device. The display device includes: a first conductive film over and in contact with a substrate; a first undercoat and a second undercoat over and in contact with the first conductive film; a pixel over the first undercoat; a wiring over the first undercoat, the first conductive film, and the second undercoat, the wiring being in contact with the first conductive film between the first undercoat and the second undercoat; and a terminal over the second undercoat, the terminal being electrically connected to the wiring. The first undercoat and the second undercoat are spaced from each other over the first conductive film and each cover a part of the first conductive film. The wiring is configured to form a terminal to which a signal for driving the pixel is input over the second undercoat.

An embodiment of the present invention is a display device. The display device includes: an undercoat over and in contact with a substrate, the undercoat having a first layer, a second layer over the first layer, and a third layer over the second layer; a first conductive film between the first layer and the second layer; a pixel and a terminal over the third layer; and a wiring over the third layer, the wiring electrically connecting the pixel to the terminal. The second layer and the third layer are each divided over the first conductive film so that the first conductive film is exposed. The wiring is in contact with the first conductive film in a region where the first conductive film is exposed from the second layer and the third layer. The region is located between the pixel and the terminal.

An embodiment of the present invention is a display device. The display device includes: an undercoat over and in contact with a substrate; a pixel over the undercoat, the pixel comprising a transistor including a semiconductor film, a gate electrode, a gate insulating film between the semiconductor film and the gate electrode, and an interlayer insulating film over the semiconductor film, the gate electrode, and the gate insulating film; a first conductive film over and in contact with the undercoat, the first conductive film existing in the same layer as the semiconductor film; a wiring over the interlayer insulating film; and a terminal over the interlayer insulating film, the terminal being electrically connected to the wiring. The gate insulating film and the interlayer insulating film are each divided over the first conductive film so that the first conductive film is exposed. The wiring is in contact with the first conductive film in a region where the first conductive film is exposed from the gate insulating film and the interlayer insulating film. The wiring is configured to form a terminal to which a signal for driving the pixel is input over the interlayer insulating film. The region is located between the pixel and the terminal.

An embodiment of the present invention is a display device. The display device includes: an undercoat over and in contact with a substrate; a pixel over the undercoat, the pixel comprising a transistor including a semiconductor film, a gate electrode, a gate insulating film between the semiconductor film and the gate electrode, and an interlayer insulating film over the semiconductor film, the gate electrode, and the gate insulating film; a first conductive film over and in contact with the gate insulating film, the first conductive film existing in the same layer as the gate electrode; a wiring over the interlayer insulating film; and a terminal over the interlayer insulating film, the terminal being electrically connected to the wiring. The interlayer insulating film is divided over the first conductive film so that the first conductive film is exposed. The wiring is in contact with the first conductive film in a region where the first conductive film is exposed from the interlayer insulating film. The region is located between the pixel and the terminal.

BRIEF DESCRIPTION OF DRAWINGS

FIG. 6A is a schematic cross-sectional view showing a manufacturing method of a display device according to an embodiment;

FIG. 6B is a schematic cross-sectional view showing a manufacturing method of a display device according to an embodiment;

FIG. 8A is a schematic cross-sectional view showing a manufacturing method of a display device according to an embodiment;

FIG. 8B is a schematic cross-sectional view showing a manufacturing method of a display device according to an embodiment;

FIG. 10A is a schematic cross-sectional view showing a manufacturing method of a display device according to an embodiment;

FIG. 10B is a schematic cross-sectional view showing a manufacturing method of a display device according to an embodiment;

FIG. 14A is a schematic cross-sectional view showing a manufacturing method of a display device according to an embodiment;

FIG. 14B is a schematic cross-sectional view showing a manufacturing method of a display device according to an embodiment;

FIG. 20A is a schematic cross-sectional view showing a manufacturing method of a display device according to conventional art; and FIG. 20B is a schematic cross-sectional view showing a manufacturing method of a display device according to conventional art.

DESCRIPTION OF EMBODIMENTS

Hereinafter, the embodiments of the present invention are explained with reference to the drawings. The invention can be implemented in a variety of different modes within its concept and should not be interpreted only within the disclosure of the embodiments exemplified below.

The drawings may be illustrated so that the width, thickness, shape, and the like are illustrated more schematically compared with those of the actual modes in order to provide a clearer explanation. However, they are only an example, and do not limit the interpretation of the invention. In the specification and the drawings, the same reference number is provided to an element that is the same as that which appears in preceding drawings, and a detailed explanation may be omitted as appropriate.

In the present specification and claims, when a plurality of films is formed by processing one film, the plurality of films may have functions or rules different from each other. However, the plurality of films originates from a film formed as the same layer in the same process and has the same layer structure and the same material. Therefore, the plurality of films is defined as films existing in the same layer.

In the specification and the claims, unless specifically stated, when a state is expressed where a structure is arranged "over" another structure, such an expression includes both a case where the substrate is arranged immediately above the "other structure" so as to be in contact with the "other structure" and a case where the structure is arranged over the "other structure" with an additional structure therebetween.

In the present specification, when a plurality of structural elements similar to one another is discriminately indicated, the structural elements are expressed by using an underscore and a natural number after a reference number. When all of the structural elements are indicated or an arbitrarily selected multiple thereof is expressed indiscriminately, only a reference number is used.

In the present specification and claims, an expression "a structural body is exposed from another structural body" means an aspect where a portion of the structural body is not covered by the other structural body and includes an aspect where the portion which is not covered by the other structural body is covered by yet another structural body.

First Embodiment

A structure of a display device 100 according to an embodiment of the present invention and a manufacturing method thereof are explained below.

Figure 1:
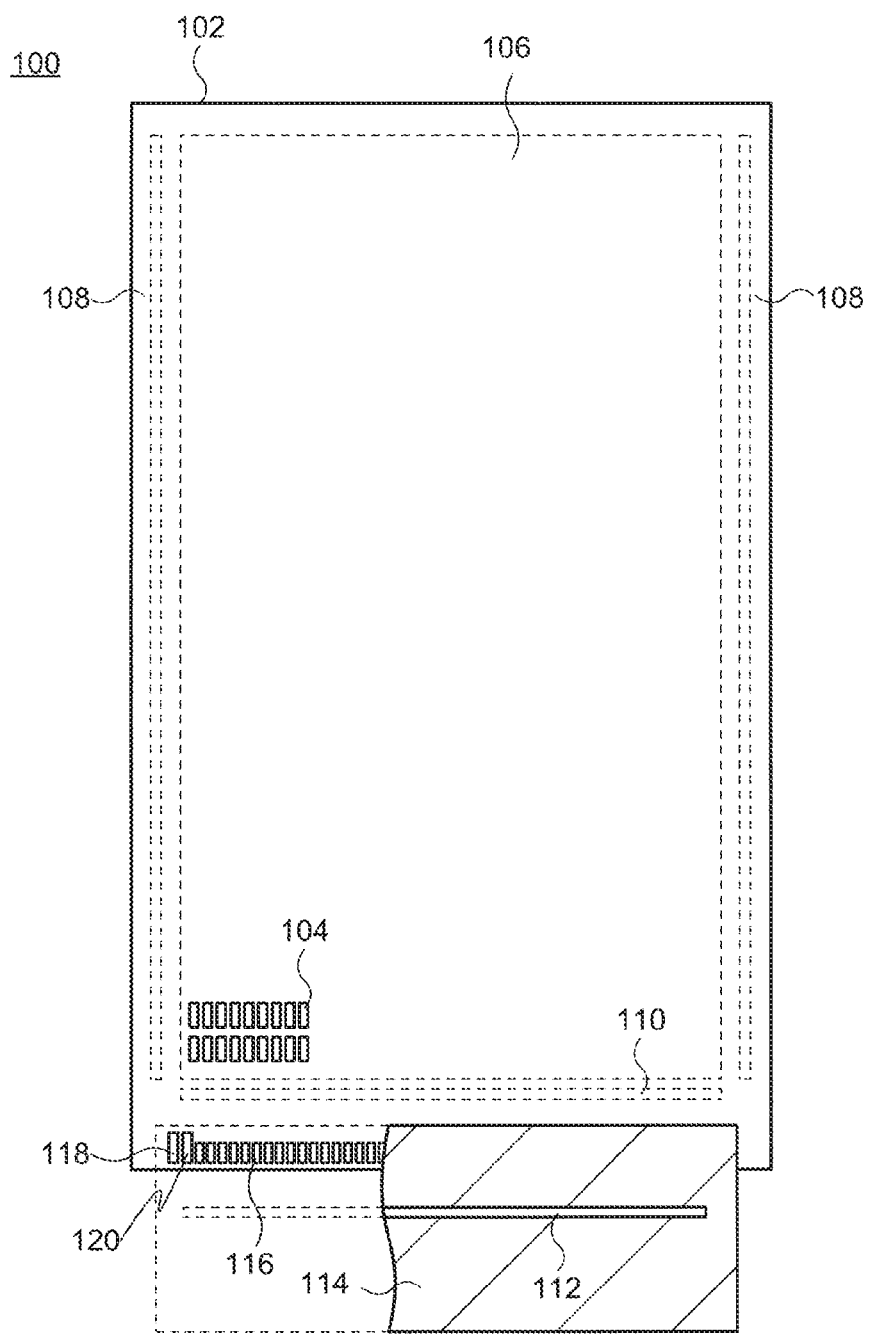
FIG. 1 is a schematic top view of a display device according to an embodiment.

A schematic top view of the display device 100 is shown in FIG. 1. The display device 100 possesses a substrate 102 and a variety of patterned insulating films, semiconductor films, and conductive films thereover. A plurality of pixels 104 and driver circuits (gate-side driver circuits 108 and source-side driver circuit 110) for driving the pixels 104 are formed by these insulating films, semiconductor films, and conductive films. The plurality of pixels 104 is periodically arranged and defines a display region 106. As described below, a display element is disposed in each pixel 104.

Hereinafter, an example is explained in which a light-emitting element 130 is provided in the pixel 104 as a display element.

The gate-side driver circuits 108 and the source-side driver circuit 110 are arranged outside the display region 106 (peripheral region). A variety of wirings (not illustrated in FIG. 1) formed with patterned conductive films extends from the display region 106, the gate-side driver circuits 108, and the source-side driver circuit 110 to a side of the substrate 102 and is exposed at a vicinity of an edge portion of the substrate 102 to form terminals such as image-signal terminals 116 and power-source terminals 118 and 120. These terminals are electrically connected to a flexible printed circuit substrate (FPC) 114. In the example shown here, a driver IC 112 having an integrated circuit formed over a semiconductor substrate is mounted over the FPC 114. The function of the source-side driver circuit 110 may be integrated with the driver IC 112, and the driver IC 112 may not be mounted over the FPC 114 but may be mounted over the substrate 102. Image signals are supplied from an external circuit (not illustrated) through the driver IC 112 and FPC 114 and transmitted to the gate-side driver circuits 108 and the source-side driver circuit 110 through the image-signal terminals 116. A power source supplied to the light-emitting elements 130 in the pixels 104 is provided to the display device 100 through the FPC 114 and the power-source terminals 118 and 120. A high potential (PVDD) is provided to the power-source terminals 120, while a potential (PVSS) lower than the PVDD is provided to the power-source terminals 118. Signals based on these image signals and potentials are supplied to each pixel 104, by which the pixels 104 are controlled and operated.

Figure 2:
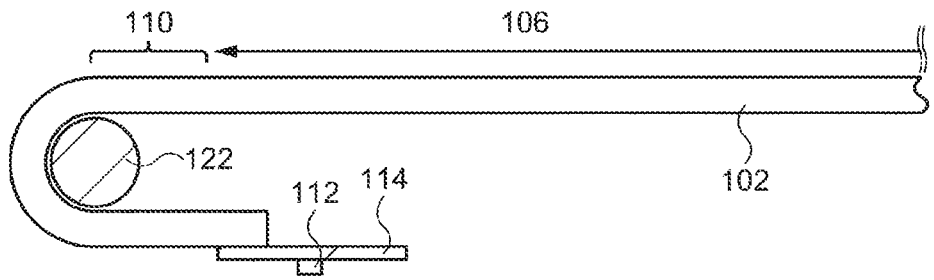
FIG. 2 is a schematic side view of a display device according to an embodiment.

Use of a flexible substrate as the substrate 102 provides the display device 100 with flexibility. For example, the display device 100 can be folded between the terminals and the display region 106 so that the FPC 114 and the terminals connected thereto overlap with the display region 106 as shown in a side view of FIG. 2. At that time, a spacer 122 may be disposed to stabilize the folded structure. At least a part of an outer circumference of the spacer 122 is covered by the substrate 102.

2. Structure of Pixel 2-1. Pixel Circuit

A pixel circuit including the light-emitting element 130 is structured with a variety of patterned insulating films, semiconductor films, and conductive films in each pixel 104. The structure of the pixel circuit can be arbitrarily selected, and an equivalent circuit is demonstrated as an example in FIG. 3.

Figure 3:
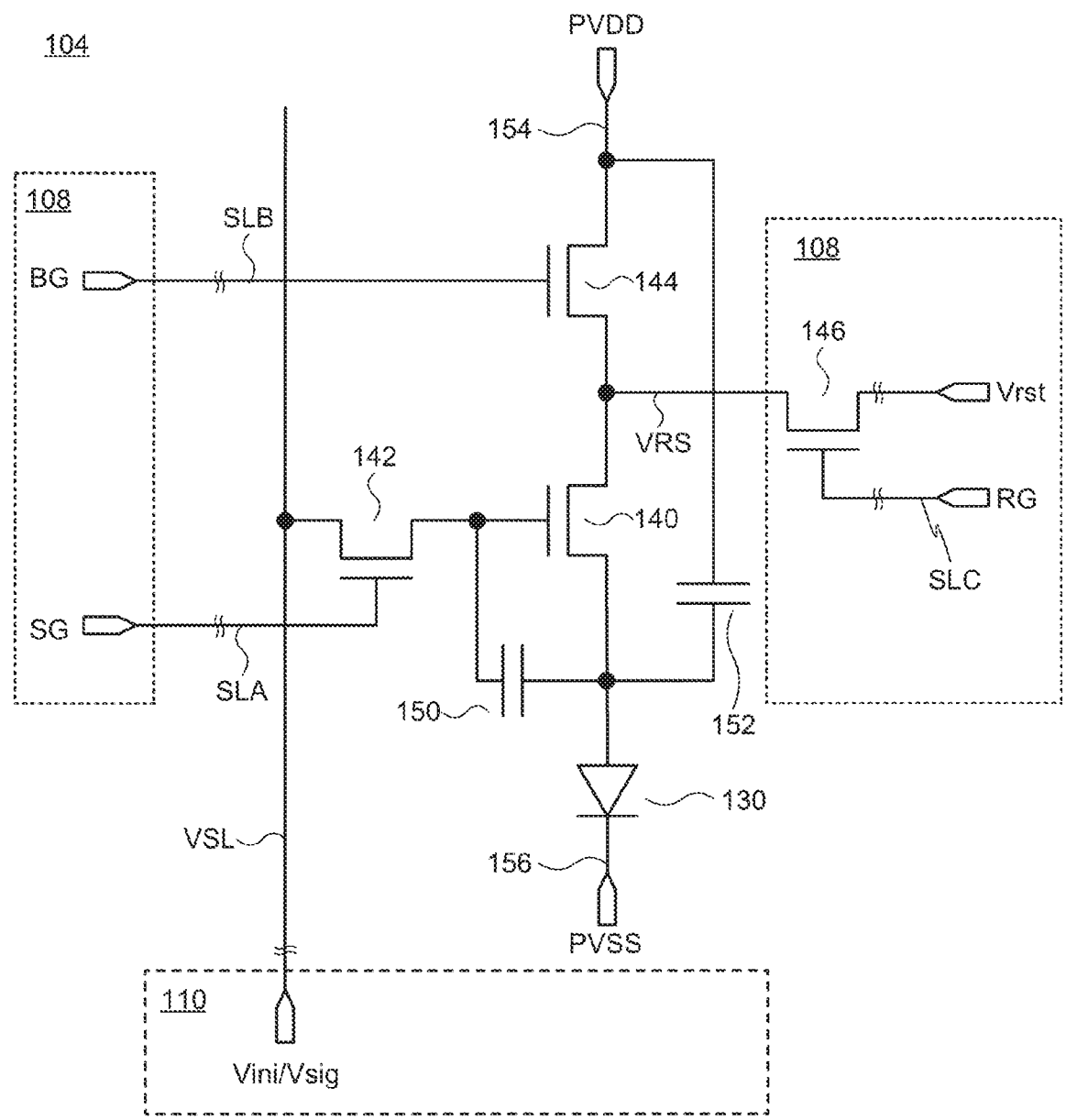
FIG. 3 is an example of an equivalent circuit of a pixel of a display device according to an embodiment.

The pixel circuit shown in FIG. 3 includes a driving transistor 140, a first switching transistor 142, a second switching transistor 144, a storage capacitor 150, and a supplementary capacitor 152 in addition to the light-emitting element 130. The light-emitting element 130, the driving transistor 140, and the second switching transistor 144 are connected in series between a high-potential power-source line 154 and a low-potential power-source line 156. The PVDD and PVSS are respectively supplied to the high-potential power-source line 154 and the low-potential power-source line 156.

In the present embodiment, the driving transistor 140 is assumed to be an n-channel type, and input-output terminals on a side of the high-potential power-source line 154 and a side of the light-emitting element 130 are defined as a drain and a source, respectively. The drain of the driving transistor 140 is electrically connected to the high-potential power-source line 154 through the second switching transistor 144, and the source thereof is electrically connected to a pixel electrode 184 of the light-emitting element 130.

A gate of the driving transistor 140 is electrically connected to a first signal line VSL through the first switching transistor 142. Operation (on/off) of the first switching transistor 142 is controlled with a scanning signal SG supplied to a first scanning signal line SLA connected to a gate thereof. When the first switching transistor 142 is on, a potential of the first signal line VSL is provided to the gate of the driving transistor 140. An initialization signal Vini and an image signal Vsig are provided to the first signal line VSL at a predetermined timing. The initialization signal Vini is a signal providing an initialization potential with a constant level. The on/off of the first switching transistor 142 is controlled at a predetermined timing while synchronizing with the first signal line VSL, and a potential based on the initialization signal Vini or the image signal Vsig is provided to the gate of the driving transistor 140.

A second signal line VRS is electrically connected to the drain of the driving transistor 140. A reset potential Vrst is supplied to the second signal line VRS through a third switching transistor 146. A timing at which the reset signal Vrst is applied through the third switching transistor 146 is controlled by a reset signal RG provided to a third signal line SLC.

The storage capacitor 150 is disposed between the source and drain of the driving transistor 140. One terminal of the supplementary capacitor 152 is connected to the source of the driving transistor 140, and the other terminal is connected to the high-potential power-source line 154. The supplementary capacitor 152 may be formed so that the other terminal is connected to the low-potential power-source line. The storage capacitor 150 and the supplementary capacitor 152 are provided to maintain a source-drain potential Vgs corresponding to the image signal Vsig when the image signal Vsig is provided to the gate of the driving transistor 140.

The source-side driver circuit 110 outputs the initialization signal Vini or the image signal Vsig to the first signal line VSL. The gate-side driver circuits 108 output the scanning signal SG, a scanning signal BG, and the reset signal RG to the first scanning line SLA, a second scanning line SLB, and the third signal line SLC, respectively.

Although it is necessary to arrange the driving transistor 140 and the first switching transistor 142 in each pixel 104 shown in FIG. 1, the second switching transistor 144 may be shared by the plurality of pixels 104 close to one another. Specifically, the second switching transistor 144 may be shared by the plurality of pixels 104 which belong to the same scanning line and which are close to one another. Additionally, although the third switching transistor 146 is arranged in the gate-side driver circuits 108 in the example shown in FIG. 3, the third switching transistor 146 may be formed in each pixel circuit. Moreover, similar to the second switching transistor 144, the third switching transistor 146 may be shared by the plurality of pixels 104 close to one another.

2-2. Cross-Sectional Structure

Figure 4:
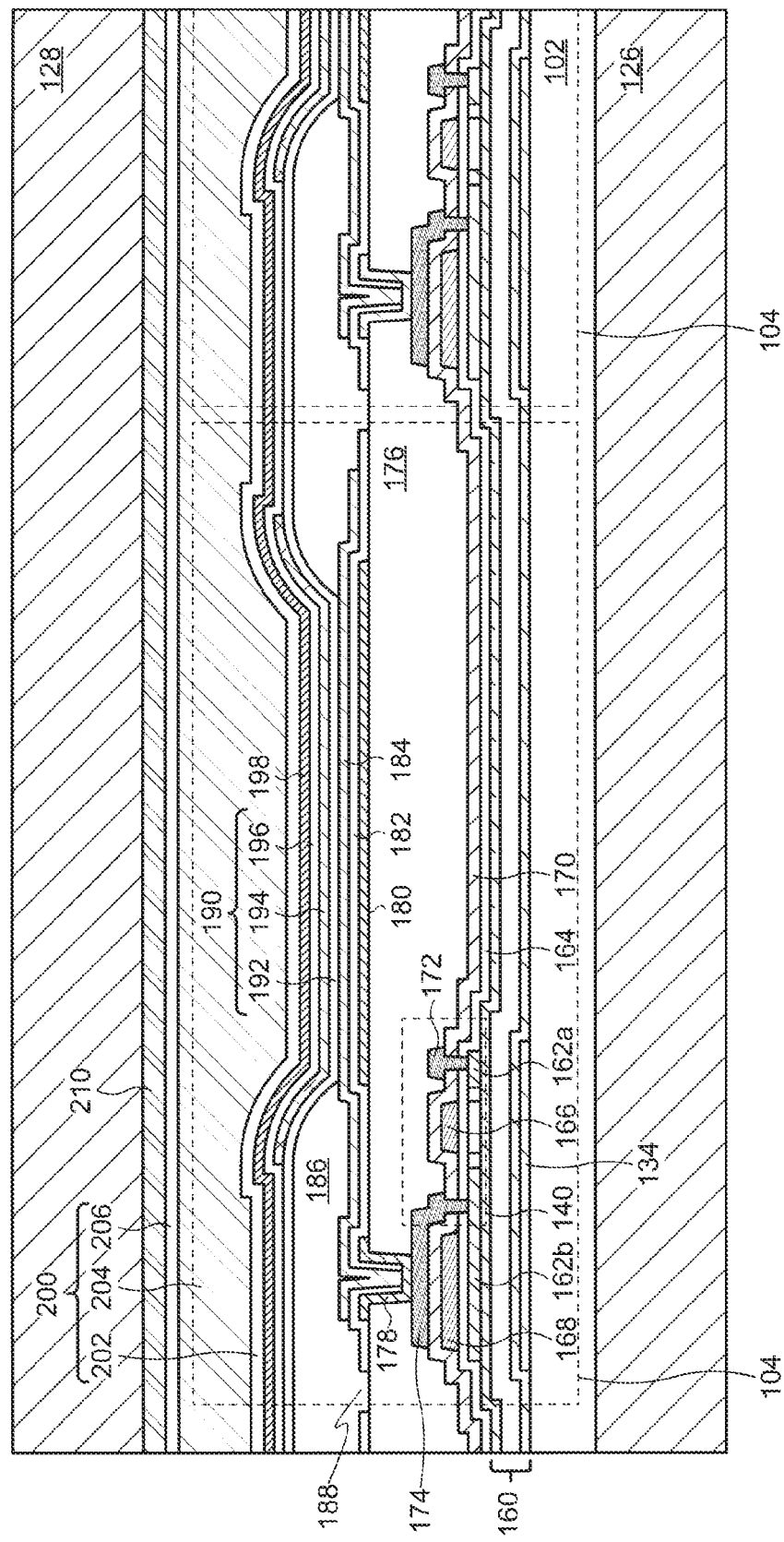
FIG. 4 is a schematic cross-sectional view of a display device according to an embodiment.

A cross-sectional structure of the pixel 104 is explained by using drawings. In FIG. 4, the cross-sectional structures of the driving transistors 140, the storage capacitors 150, the supplementary capacitors 152, and the light-emitting elements 130 of the pixel circuits of adjacent two pixels 104 formed over the substrate 102 are illustrated.

Each element included in the pixel circuit is disposed over the substrate 102 through an undercoat 160. The driving transistor 140 includes a semiconductor film 162, a gate insulating film 164, a gate electrode 166, a drain electrode 172, and a source electrode 174. The gate electrode 166 is arranged to intersect at least a part of the semiconductor film 162 via the gate insulating film 164, and a channel is formed in a region where the gate electrode 166 overlaps with the semiconductor film 162. The semiconductor film 162 further possesses a drain region 162a and a source region 162b sandwiching the channel.

Each pixel 104 may have, as an optional structure, a conductive film (hereinafter, referred to as a second conductive film) 134 overlapping with the transistors in the pixel circuit, such as the driving transistor 140. The second conductive film 134 may be arranged between each transistor and the substrate 102 and may be disposed between the substrate 102 and the undercoat 160 as shown in FIG. 4, for example. It is not necessary for the second conductive film 134 to entirely overlap with each transistor, and the second conductive film 134 may be provided so as to overlap with at least the channel of each transistor. The second conductive film 134 includes a metal such as aluminum, copper, chromium, molybdenum, tungsten, and titanium or an alloy thereof and is prepared to have a single-layer structure or a stacked-layer structure. The second conductive film 134 is formed at a thickness which does not allow visible light and ultraviolet light to pass therethrough, and the thickness is specifically 20 nm to 100 nm. This structure enables suppression of light-induced deviation in property of the transistors in the pixel circuit. The second conductive film 134 may be electrically floated or may be configured to be electrically connected to the gate electrode of the transistor overlapping with the second conductive film 134 so as to have an equipotential to the gate electrode. In addition, the second conductive film 134 may be configured to be supplied with a potential different from that of the gate electrode, such as a ground potential or a specific power-source potential over the substrate 102. Such a configuration enables precise control of the properties of the transistors. Note that, in a case where the second conductive film 134 is not provided, the substrate 102 is in direct contact with the undercoat 160 under the channel of each transistor.

A capacitor electrode 168 existing in the same layer as the gate electrode 166 is formed to overlap with the source region 162b through the gate insulating film 164. An interlayer insulating film 170 is disposed over the gate electrode 166 and the capacitor electrode 168. Openings reaching the drain region 162a and the source region 162b are formed in the interlayer insulating film 170 and the gate insulating film 164, and the drain electrode 172 and the source electrode 174 are arranged so as to cover the openings. A part of the source electrode 174 overlaps with a part of the source region 162b and the capacitor electrode 168 through the interlayer insulating film 170, and the storage capacitor 150 is structured by the part of the source region 162b, the gate insulating film 164, the capacitor electrode 168, the interlayer insulating film 170, and the part of the source electrode 174.

A planarization film 176 is further provided over the driving transistor 140 and the storage capacitor 150. The planarization film 176 has an opening reaching the source electrode 174, and a connection electrode 178 covering this opening and a part of a top surface of the planarization film 176 is formed to be in contact with the source electrode 174. The supplementary capacitor electrode 180 is further disposed over the planarization film 176. The connection electrode 178 and the supplementary capacitor electrode 180 may be simultaneously formed and can exist in the same layer. A capacitor insulating film 182 is formed to cover the connection electrode 178 and the supplementary capacitor electrode 180. The capacitor insulating film 182 does not cover a part of the connection electrode 178 in the opening of the planarization film 176 to expose a top surface of the connection electrode 178. This structure enables electrical connection between the pixel electrode 184 formed over the connection electrode 178 and the source electrode 174 via the connection electrode 178. An opening 188 may be formed in the capacitor insulating film 182 to allow contact of a partition wall 186 formed thereover with the planarization film 176. Impurities in the planarization film 176 can be removed through the opening 188, thereby improving reliability of the light-emitting element 130. Note that the formation of the connection electrode 178 and the opening 188 is optional.

The pixel electrode 184 is disposed over the capacitor insulating film 182 to cover the connection electrode 178 and the supplementary capacitor electrode 180. The capacitor insulating film 182 is sandwiched by the supplementary capacitor electrode 180 and the pixel electrode 184, and the supplementary capacitor 152 is configured by this structure. The pixel electrode 184 is shared by the supplementary capacitor 152 and the light-emitting element 130.

The partition wall 186 is provided over the pixel electrode 184 to cover an edge portion of the pixel electrode 184. An EL layer 190 and an opposing electrode 198 thereover is arranged so as to cover the partition wall 186.

The EL layer 190 may be composed of a plurality of layers and is formed by combining a variety of functional layers such as a carrier-injection layer, a carrier-transporting layer, an emission layer, a carrier-blocking layer, and an exciton-blocking layer. The structure of the EL layer 190 may be the same in all of the pixels 104, or the EL layer 190 may be formed so that a part of the structure is different between the adjacent pixels 104. In FIG. 4, a hole-transporting layer 192, an emission layer 194, and an electron-transporting layer 196 are illustrated as the typical functional layers.

A protection film (hereinafter, referred to as a passivation film) 200 is arranged over the light-emitting elements 130 to protect the light-emitting elements 130. The structure of the passivation film 200 can be arbitrarily selected, and a stacked structure including a first layer 202 containing an inorganic compound, a second layer 204 containing an organic compound, and a third layer 206 containing an inorganic compound may be applied as shown in FIG. 4.

A film (hereinafter, referred to as a resin film) 210 including a resin is disposed over the passivation film 200. The display device 100 further possesses supporting films 126 and 128 sandwiching the structure from the substrate 102 to the resin film 210, and appropriate physical strength is provided by the supporting films 126 and 128. The supporting films 126 and 128 are respectively fixed to the substrate 102 and the resin film 210 with an adhesive layer which is not illustrated.

As described below in detail, the undercoat 160, the gate insulating film 164, the interlayer insulating film 170, the capacitor insulating film 182, the first layer 202, and the third layer 206 are each an insulating film and include a film including a silicon-containing inorganic compound such as silicon nitride, silicon oxide, silicon nitride oxide, and silicon oxynitride. The films including a silicon-containing inorganic compound may be stacked in each insulating film. Therefore, these insulating films each include an inorganic compound containing silicon as a main structural element.

3. Terminals and Wirings

Figure 5:
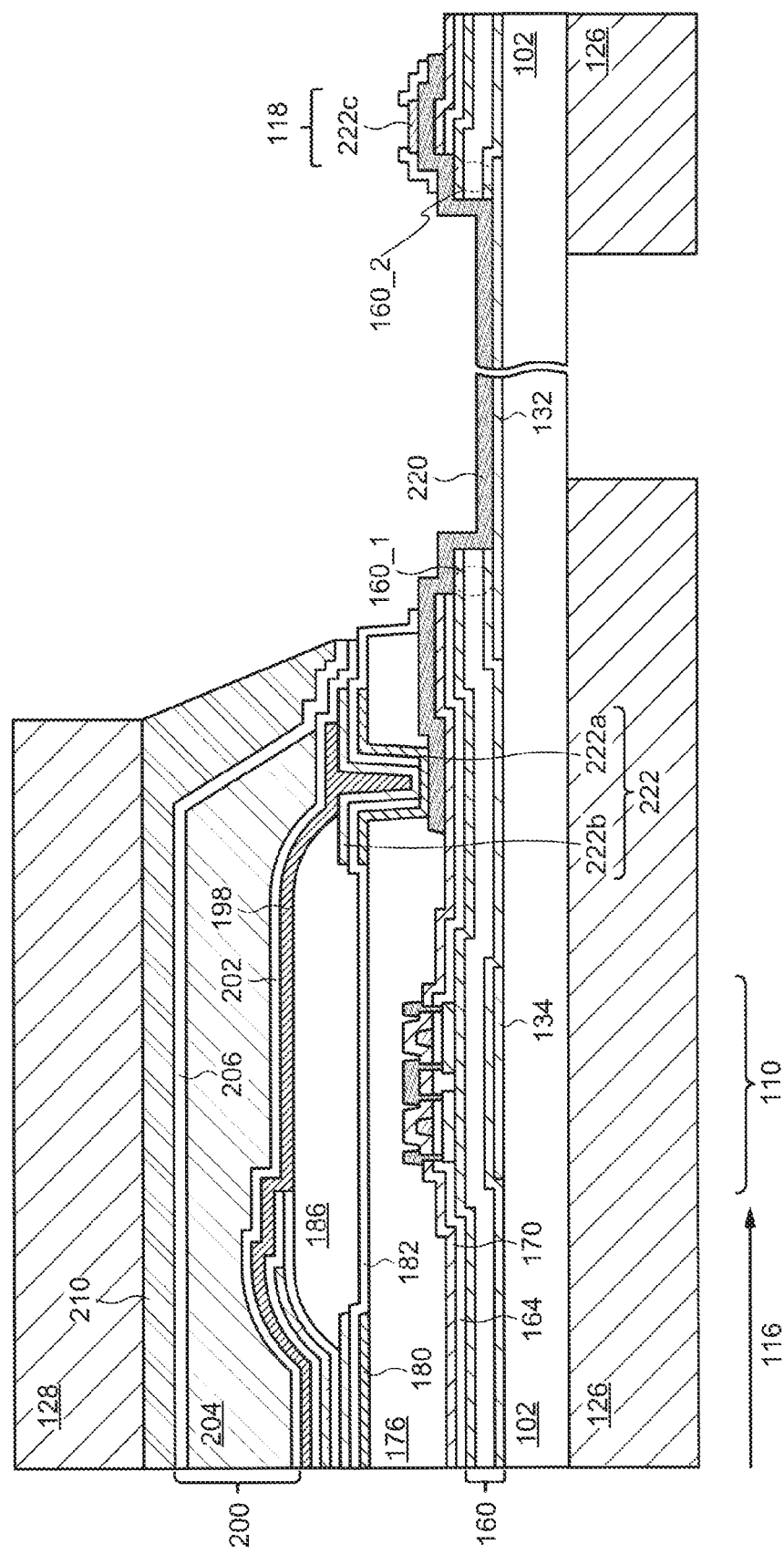
FIG. 5 is a schematic cross-sectional view of a display device according to an embodiment.

FIG. 5 schematically shows an example of a cross-sectional structure in which the region from an edge portion of the display region 106 (lower portion of the display region 106 in FIG. 1) to the power-source terminals 118 and 120 and the image-signal terminals 116 is at the center. Here, the cross-sections of a part of the display region 106, the source-side driver circuit 110, the power-source terminal 118, and the wiring 220 electrically connecting the display region 106 to the power-source terminal 118 are illustrated.

As shown in FIG. 5, the supporting film 126 is divided into two portions by removing a part thereof, and a lower surface of the substrate 102 is exposed between the divided portions. The part where the supporting film 126 is removed has high flexibility, and the three-dimensional structure demonstrated in FIG. 2 can be provided to the display device 100 by utilizing this portion to fold the substrate 102.

A conductive film (hereinafter, referred to as a first conductive film) 132 is disposed over the substrate 102 so as to be in contact with the substrate 102 and overlap with the region where the supporting film 126 is removed. The first conductive film 132 may exist in the same layer as the second conductive film 134. Thus, the first conductive film 132 has the same layer structure and composition as the second conductive film 134.

The undercoat 160 extends to the power-source terminal 118 from the pixel 104, and a part of the undercoat 160 is removed in the region where the supporting film 126 is removed. That is, the undercoat 160 is divided over the first conductive film 132 to provide a first undercoat 160_1 over which the pixel 104 is provided and a second undercoat 160_2 over which the power-source terminals 118 and 120 and the image-signal terminals 116 are provided. The first undercoat 160_1 and the second undercoat 160_2 are spaced from each other and cover a part of the conductive film 132. Thus, the part of the first conductive film 132 is located between the substrate 102 and the first undercoat 160_1 or between the substrate 102 and the second undercoat 160_2, and another portion is exposed from the first undercoat 160_1 and the second undercoat 160_2.

The gate insulating film 164 and the interlayer insulating film 170 formed in the display region 106 also extend in a direction toward the power-source terminal 118 and are each divided in a region overlapping with the first conductive film 132 to provide two portions spaced from each other, similar to the undercoat 160. Side surfaces of the gate insulating film 154 and the interlayer insulating film 170 may be located in the same plane as side surfaces of the first undercoat 160_1 and the second undercoat 160_2. Alternatively, the gate insulating film 154 and the interlayer insulating film 170 may be arranged so as to expose top surfaces of the first undercoat 160_1 and the second undercoat 160_2 as shown in FIG. 5.

Semiconductor elements such as a transistor are provided in the source-side driver circuit 110, and a variety of circuits such as an analogue circuit is structured by the semiconductor elements. As shown in FIG. 5, the second conductive film 134 may be disposed under the transistor formed in the source-side driver circuit 110.

The wiring 220 is disposed over the first conductive film 132. In the example demonstrated in FIG. 5, the wiring 220 is provided so as to be sandwiched by the interlayer insulating film 170 and the planarization film 176. In other words, the wiring 220 exists in the same layer as the source electrodes and the drain electrodes of the transistors in the pixel circuit. Although not illustrated, the wiring 220 may be in the same layer as the gate electrodes.

The wiring 220 is in contact with and electrically connected to the first conductive film 132 in the region where the first conductive film 132 is exposed from the first undercoat 160_1 and the second undercoat 160_2, that is, between the first undercoat 160_1 and the second undercoat 160_2. Since the undercoat 160, the gate insulating film 164, and the interlayer insulating film 170 are divided in this region, the wiring 220 is in contact with the side surfaces of these insulating films. Furthermore, the wiring 220 may be in contact with the top surfaces of the first undercoat 160_1 and the second undercoat 160_2 as shown in FIG. 5.

The opposing electrode 198 extends from the display region 106 to the edge portion of the substrate 102 and is electrically connected to the wiring 220 in an opening formed in the planarization film 176. Specifically, the planarization film 176 has the opening reaching the wiring 220 between the source-side driver circuit 110 and the power-source terminal 118, and a contact electrode 222 including a first contact electrode 222a and a second contact electrode 222b over the first contact electrode 222a is disposed so as to cover this opening. The opposing electrode 198 is electrically connected to the wiring 220 through the second contact electrode 222b and the first contact electrode 222a.

The wiring 220 further forms the power-source terminals 118 and 120 and the image-signal terminals 116 over the second undercoat 160_2 at the vicinity of the edge portion of the substrate 102. Surfaces of these terminals are covered by protection electrodes 222c existing in the same layer as the first contact electrode 222a. As described above, these terminals are input with a variety of signals for driving the pixels 104.

4, Manufacturing Method

Hereinafter, an example of a manufacturing method of the display device 100 is explained using FIG. 6A to FIG. 16. FIG. 6A, FIG. 6B, FIG. 8A, FIG. 8B, FIG. 10A, FIG. 10B, and FIG. 13A to FIG. 16 each contain two drawings: those on the left side are schematic cross-sectional views of the pixel 104, and those on the right side are schematic cross-sectional views focusing on the wiring 220. FIG. 7A, FIG. 7B, FIG. 9A, FIG. 9B, FIG. 11A, and FIG. 11B are top views in the stages shown in FIG. 6A, FIG. 6B, FIG. 8A, FIG. 10A, and FIG. 10B, respectively, and mainly demonstrate the region over which the wiring 220 and the terminals are formed.

As shown in FIG. 6A, the substrate 102 is first formed over a supporting substrate 103. The supporting substrate 103 supports a variety of insulating films, conductive films, and semiconductor films included in the display device 100 during the manufacturing process of the display device 100 and may contain glass or quartz. The substrate 102 is a flexible substrate and contains a polymer such as a polyimide, a polyamide, and a polycarbonate. The substrate 102 is disposed over the supporting substrate 103 with a wet-type film-formation method such as an ink-jet method, a spin-coating method, and a printing method or a lamination method. When flexibility is not provided to the display device 100, the substrate 103 may be used instead of the substrate 102.

Next, the first conductive film 132 and the second conductive film 134 are formed over the substrate 102. The first conductive film 132 and the second conductive film 134 include the metal or alloy described above and are formed by performing patterning with etching on a metal film prepared with a chemical vapor deposition (CVD) method or a sputtering method. The first conductive film 132 and the second conductive film 134 may have a stacked-layer structure or a single-layer structure. When the first conductive film 132 and the second conductive film 134 are thus prepared simultaneously, these films have the same composition and the same layer structure. The first conductive film 132 is located between the display region 106 and the region in which the terminals are to be formed and prepared in a stripe shape so as to overlap with the wiring 220 formed later. The second conductive film 134 is disposed so as to overlap with the channels of the transistors in the pixel circuit.

Figure 7A:
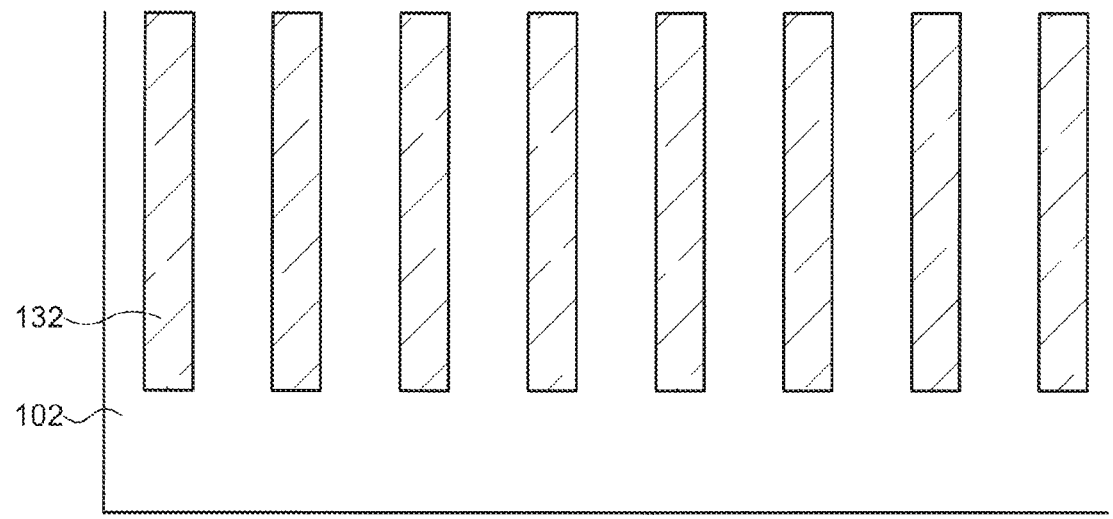
FIG. 7A is a schematic top view showing a manufacturing method of a display device according to an embodiment.
Figure 7B:
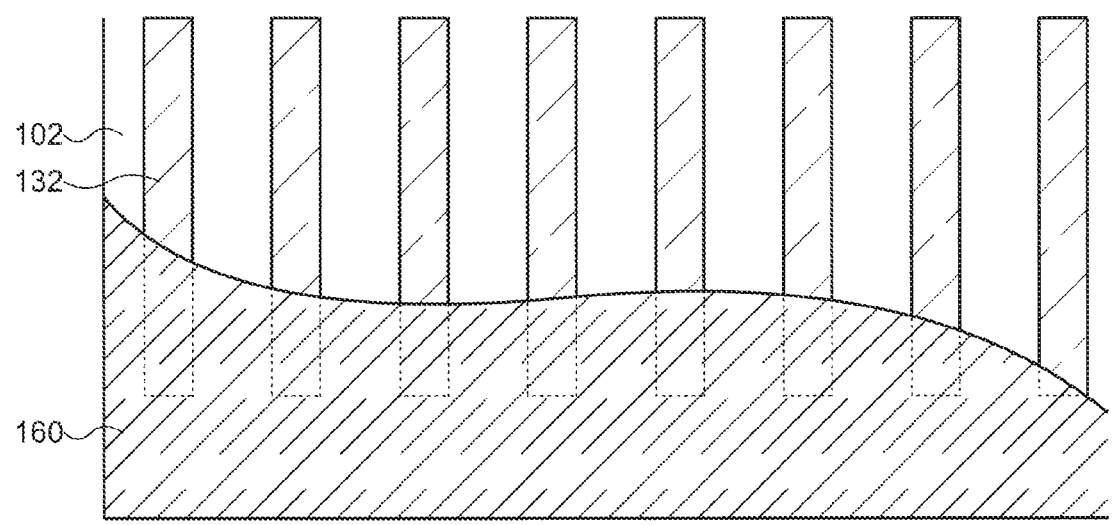
FIG. 7B is a schematic top view showing a manufacturing method of a display device according to an embodiment.

Next, the undercoat 160 is formed over the first conductive film 132 and the second conductive film 134 so as to have a single-layer structure or a stacked-layer structure (FIG. 6B, FIG. 7B). Although the undercoat 160 is formed over the entire surface of the substrate 102, a part thereof is not illustrated in FIG. 7B for promoting understanding. Here, stacked films of the first layer 160a to the third layer 160c are demonstrated as the undercoat 160, and a silicon-oxide film, a silicon-nitride film, and a silicon-oxide film may be respectively used for the first layer 160a to the third layer 160c, for example. In this case, the first layer 160a is formed to improve adhesion to the substrate 102, the second layer 160b is provided as a blocking film against impurities such as water, and the third layer 160c is provided as a blocking film to prevent diffusion of hydrogen atoms included in the second layer 160b. Here, a silicon-oxide film is a film containing silicon and oxygen as main components, while a silicon-nitride film is a film containing silicon and nitrogen as main components.

Next, the transistors and the like in the pixel circuit are fabricated over the undercoat 160 (FIG. 8A). Here, although formation of the n-channel type driving transistor 140 as a transistor having polysilicon as the semiconductor film 162 and the storage capacitor 150 is described as an example, a p-channel type transistor may be simultaneously formed. Specifically, the semiconductor film 162, the gate insulating film 164, the gate electrode 166, and the capacitor electrode 168 are sequentially formed over the undercoat 160. The semiconductor film 162 has a structure in which, in addition to a channel region 162c overlapping with the gate electrode 166, drain region 162a, and the source region 162b, low-concentration impurity regions 162d are arranged between the channel region 162c and the drain region 162a and between the channel region 162c and the source region 162b. The gate insulating film 164 includes a silicon-containing inorganic compound, and a silicon-oxide film or the like is employed. The gate electrode 166 and the capacitor electrode 168 are prepared using a wiring (first wiring) including a metal selected from a variety of metals or an alloy thereof, and the first wiring possesses a stacked structure of molybdenum and tungsten, for example. The capacitor electrode 168 exists in the same layer as the gate electrode 166 and is used to fabricate the storage capacitor 150 as well as the formation of the gate insulating film 164 and the source region 162b.

Figure 9A:
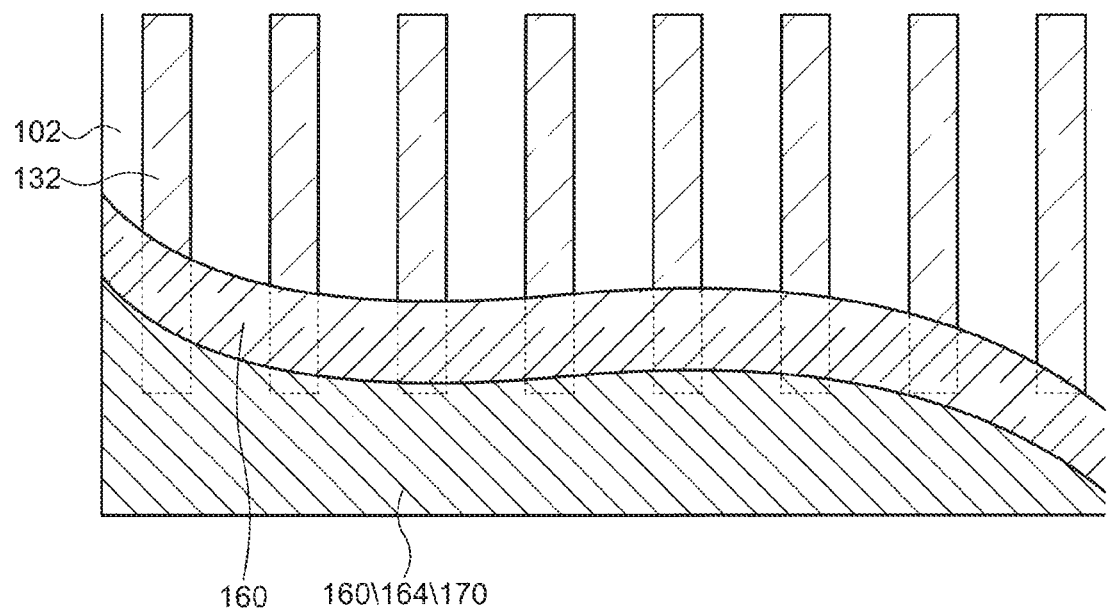
FIG. 9A is a schematic top view showing a manufacturing method of a display device according to an embodiment.

The interlayer insulating film 170 is formed over the gate electrode 166 and the capacitor electrode 168 (FIG. 8A and FIG. 9A). The interlayer insulating film 170 is also prepared over almost all of the surface of the substrate 102 to cover not only the display region 106 but also the region where the terminals, the wiring 220, and the first conductive layer 132 are formed. Although the interlayer insulating film 170 having a single-layer structure is illustrated in FIG. 8B, the interlayer insulating film 170 may be formed by stacking a silicon-nitride film and a silicon-oxide film, for example. A part of the undercoat 160, the gate insulating film 164, and the interlayer insulating film 170 are not illustrated in FIG. 9B for promoting understanding.

Figure 9B:
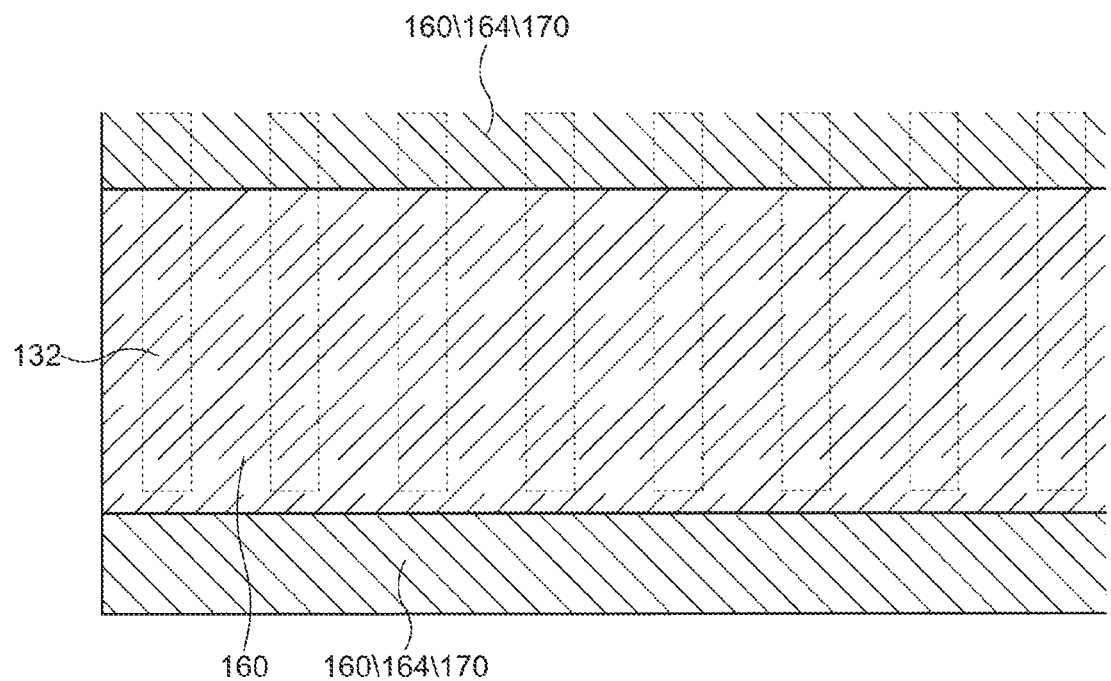
FIG. 9B is a schematic top view showing a manufacturing method of a display device according to an embodiment.

After that, patterning is performed to partly remove the interlayer insulating film 170 and the gate insulating film 164, thereby exposing the undercoat 160 in the region overlapping with the first conductive film 132 (FIG. 8B, FIG. 9B). At that time, the openings for exposing the drain region 162a and the source region 162b are simultaneously formed.

Figure 11A:
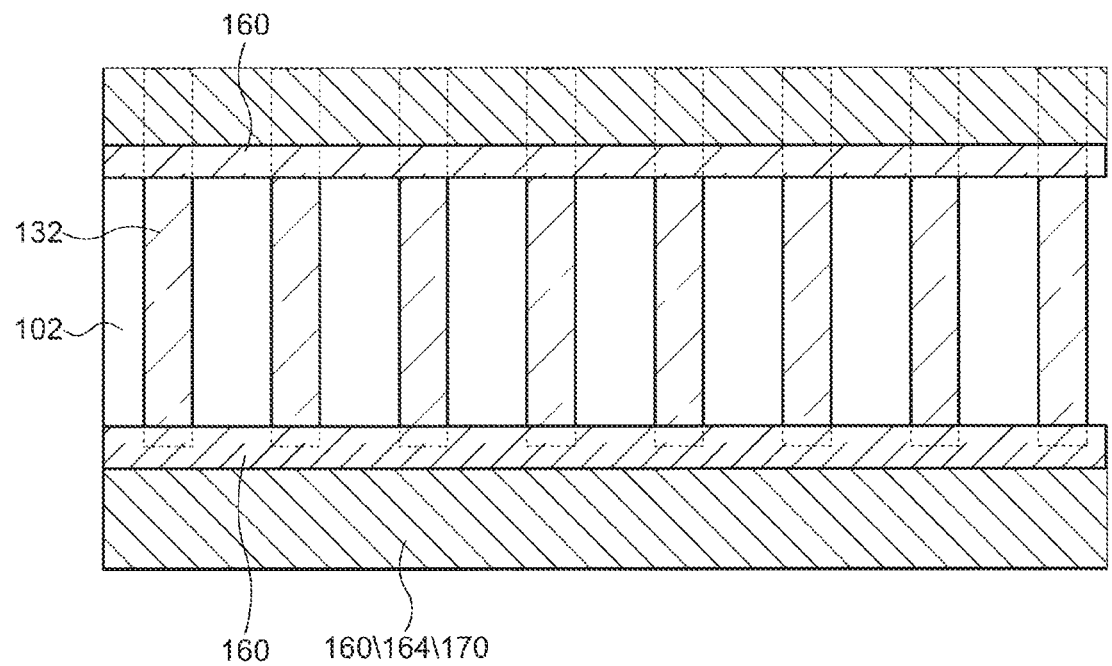
FIG. 11A is a schematic top view showing a manufacturing method of a display device according to an embodiment.

Next, the first conductive film 132 is exposed. Specifically, the region other than the region where the first conductive film 132 is exposed is covered with a resist mask, and the undercoat 160 is removed with etching (FIG. 10A, FIG. 11A). With this process, the undercoat 160 is divided to form the first undercoat 160_1 and the second undercoat 160_2 spaced from each other, and the substrate 102 is exposed between the adjacent first conductive films 132. An example is demonstrated in FIG. 10A in which the side surfaces of the gate insulating film 164 and the interlayer insulating film 170 overlap with the top surface of the undercoat 160. However, the undercoat 160 may be simultaneously removed when the openings for exposing the drain region 162a and the source region 162b are formed. In this case, the side surfaces of the gate insulating film 164 and the interlayer insulating film 170 are located in the same plane as the side surface of the undercoat 160.

Figure 11B:
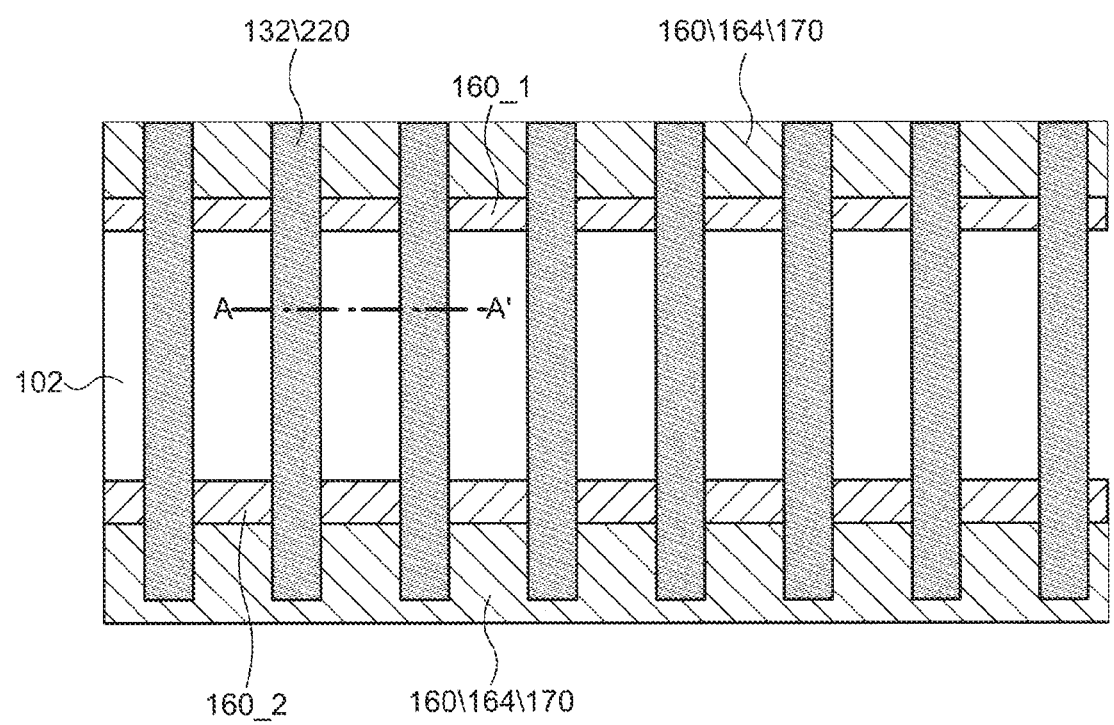
FIG. 11B is a schematic top view showing a manufacturing method of a display device according to an embodiment.

Next, etching is carried out after forming a conductive film by using a second wiring to form the drain electrode 172, the source electrode 174, and the wiring 220 (FIG. 10B, FIG. 11B). The second wiring may be also formed as a single metal film or a stack of a plurality of metal films, and a two-layer structure of aluminum/titanium, a three-layer stacked structure of titanium/aluminum/titanium, and the like may be employed. The drain electrode 172 and the source electrode 174 are prepared so as to be in contact with the drain region 162a and the source region 162b, respectively, thereby fabricating the driving transistor 140. The part of the source electrode 174 is arranged to overlap with the capacitor electrode 168, and the storage capacitor 150 is formed by the source region 162b, the gate insulating film 164, the capacitor electrode 168, the interlayer insulating film 170, and the part of the source electrode 174. The wiring 220 is in contact with a top surface of the first conductive film 132 and the side surface of the undercoat 160 and is formed in a stripe form so as to overlap with the first conductive film 132. The wiring 220 may be further in contact with not only the top surfaces of the first undercoat 160_1 and the second undercoat 160_2 but also the side surface of the gate insulating film 164 and the side surface of the interlayer insulating film 170 over the first undercoat 160_1 and the second undercoat 160_2. The wiring 220 provides the power-source terminal 118 for connecting the FPC 114 later.

Figure 12A:
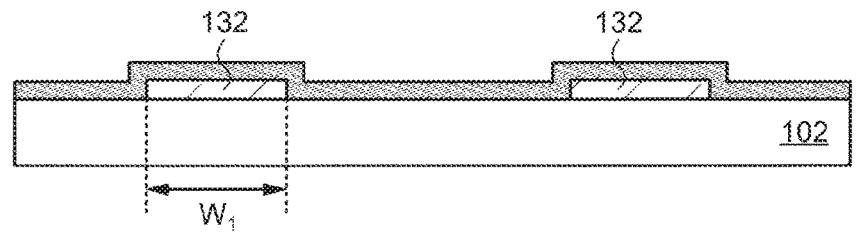
FIG. 12A is a schematic cross-sectional view showing a manufacturing method of a display device according to an embodiment.

Schematic cross-sectional views along a dotted chain A-A' in FIG. 11B are shown in FIG. 12A to FIG. 12E. FIG. 12A schematically represents the state before etching the conductive film formed with the second wiring. A width of the first conductive film 132 at that time is defined as $W_1$.

Figure 12B:
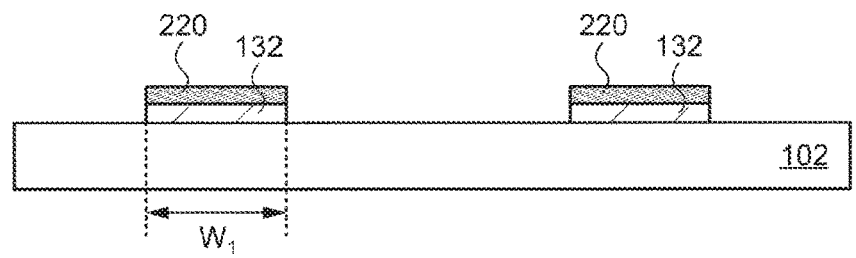
FIG. 12B is a schematic cross-sectional view showing a manufacturing method of a display device according to an embodiment.
Figure 12C:
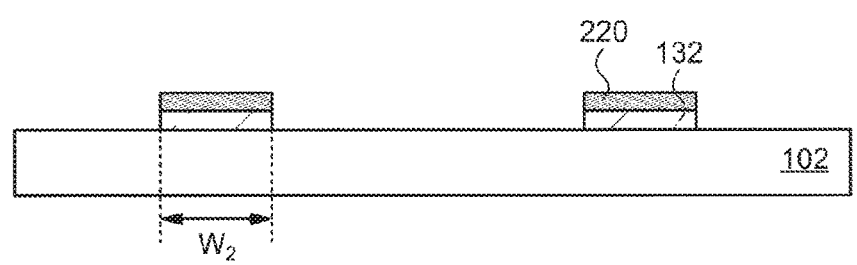
FIG. 12C is a schematic cross-sectional view showing a manufacturing method of a display device according to an embodiment.
Figure 12D:
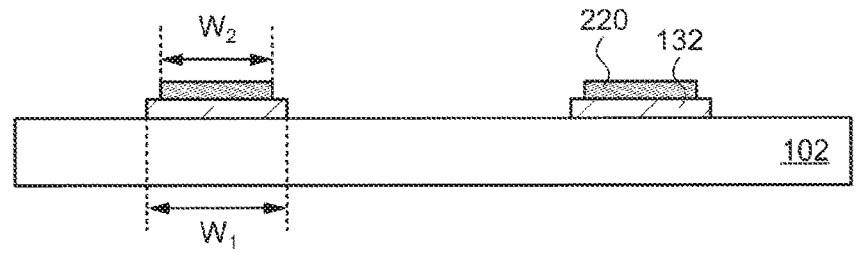
FIG. 12D is a schematic cross-sectional view showing a manufacturing method of a display device according to an embodiment.
Figure 12E:
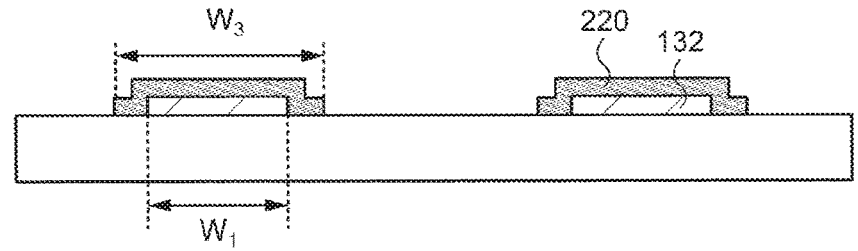
FIG. 12E is a schematic cross-sectional view showing a manufacturing method of a display device according to an embodiment.

The etching of the second wiring may be performed so that the width of the wiring 220 becomes $W_1$ as shown in FIG. 12B. Alternatively, the first conductive film 132 may be also etched when the etching of the second wiring is performed so that the widths of the first conductive film 132 and the wiring 220 each become $W_2$ which is smaller than $W_1$ (FIG. 12C). Alternatively, the etching may be selectively performed on the second wiring so that the width $W_2$ of the wiring 220 becomes smaller than the width $W_1$ of the first conductive film 132 as shown in FIG. 12D. Alternatively, the wiring 220 may be formed so as to cover the top and side surfaces of the first conductive film 132. In this case, the width of the wiring 220 becomes $W_3$ which is larger than $W_1$.

Figure 13A:
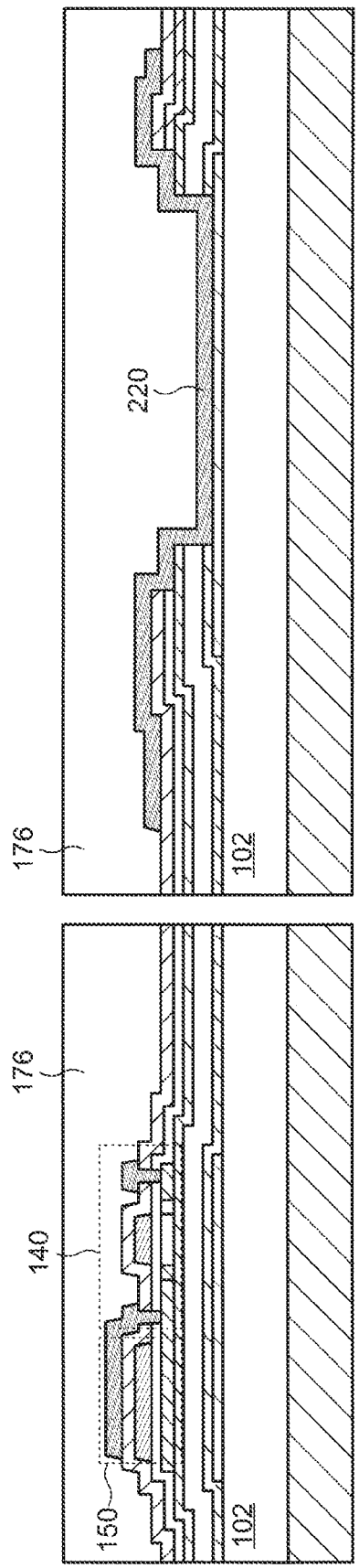
FIG. 13A is a schematic cross-sectional view showing a manufacturing method of a display device according to an embodiment.
Figure 13B:
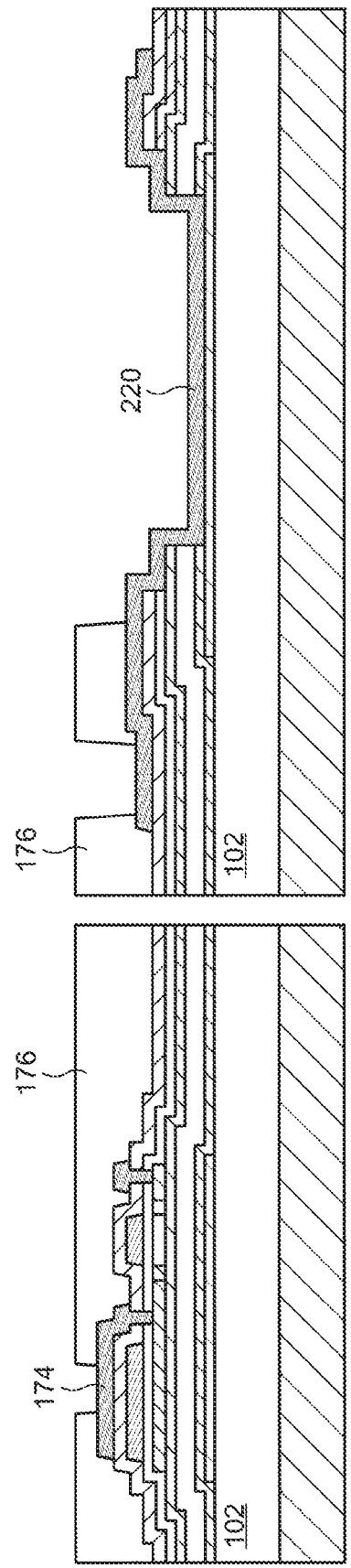
FIG. 13B is a schematic cross-sectional view showing a manufacturing method of a display device according to an embodiment.

After that, the planarization film 176 is formed so as to cover the driving transistor 140, the storage capacitor 150, and the wiring 220 (FIG. 13A). An organic compound such as a photo-sensitive acrylic resin is used for the planarization film 176, by which an insulating film with high planarity can be provided. After forming the planarization film 176 over almost all of the surface of the substrate 102, a part of the planarization film 176 is removed to form the openings for the connection between the source electrode 174 and the pixel electrode 184 and the connection between the wiring 220 and the contact electrode 222. At the same time, the planarization film 176 over the second undercoat 160_2 and between the first undercoat 160_1 and the second undercoat 160_2 is removed. After that, the source electrode 174 and the wiring 220 which are exposed by removing the planarization film 176 are protected by using a conductive oxide such as indium-tin oxide (ITO) and indium-zinc oxide (IZO). That is, the connection electrode 178 connected to the source electrode 174 as well as the first contact electrode 222a and the protection electrode 222c connected to the wiring 220 are formed. The formation of these electrodes prevents the source electrode 174 and the wiring 220 from deteriorating in the following processes. Simultaneously, the supplementary capacitor electrode 180 is formed over the planarization film 176 (FIG. 14A).

Next, the capacitor insulating film 182 is formed to cover the connection electrode 178, the first contact electrode 222a, and the protection electrode 222c. The capacitor insulating film 182 may include a silicon-containing inorganic film, and a silicon-nitride film is typically employed. The capacitor insulating film 182 is also formed by preparing an insulating film over almost all of the surface of the substrate 102, followed by patterning with etching to partly remove the insulating film so that the top surfaces of the connection electrode 178 and the first contact electrode 222a, a surface of the protection electrode 222c other than an edge portion thereof, and the wiring 220 are exposed (FIG. 14A). With this process, the terminals such as the power-source terminal 118 are fabricated. Simultaneously, the opening 188 is formed.

Next, the pixel electrode 184 is formed (FIG. 14A). The structure of the pixel electrode 184 is arbitrarily selected, and a three-layer stacked structure of IZO, silver, and IZO may be employed when the pixel electrode 184 is used as a reflective electrode, for example. The pixel electrode 184 is formed so as to be electrically connected to the connection electrode 178 and overlap with the supplementary capacitor electrode 180. With this process, the pixel electrode 184 is electrically connected to the driving transistor 140, and the supplementary capacitor 152 is fabricated by the pixel electrode 184, the capacitor insulating film 182, and the supplementary capacitor electrode 180 in the pixel 104. Moreover, the second contact electrode 222b is simultaneously formed so as to overlap with and be electrically connected to the first contact electrode 222a when the pixel electrode 184 is formed.

After forming the pixel electrode 184, the partition wall (also called a bank or a rib) 186 is formed (FIG. 14B). Similar to the planarization film 176, the partition wall 186 is formed by using a photo-sensitive acrylic resin or the like. The partition wall 186 covers the edge portion of the pixel electrode 184 and possesses an opening exposing a surface of the pixel electrode 184 to allow the surface to function as an emission region. It is preferred that an edge of the opening preferably have a moderately tapered shape. If the edge of the opening is steeply tapered, a coverage deficiency of the EL layer 190 formed later may be caused. Here, the planarization film 176 and the partition wall 186 are in contact with each other through the opening 188 formed in the capacitor insulating film 182 therebetween. This structure allows impurities such as water and an organic compound eliminated from the planarization film 176 through a heating treatment after the formation of the partition wall 186 to be released.

After forming the partition wall 186, the EL layer 190 is prepared (FIG. 14B). The functional layers included in the EL layer 190 may be formed with an evaporation method or a wet-type film-formation method. After forming the EL layer 190, the opposing electrode 198 is formed. Here, the opposing electrode 198 is configured to exhibit a light-transmitting property with respect to visible light since the light-emitting element 130 is fabricated with a so-called top-emission structure. For example, the opposing electrode 198 is formed by depositing an alloy of magnesium and silver at a thickness allowing the light emitted from the EL layer 190 to pass therethrough. The opposing electrode 198 is formed to cover not only the display region 106 but also the contact electrode 222 and is electrically connected to the wiring 220 via the first contact electrode 222a and the second contact electrode 222b. This structure allows the power-source potential (PVDD) provided from the power-source terminal 118 to be supplied to the opposing electrode 198.

Figure 15:
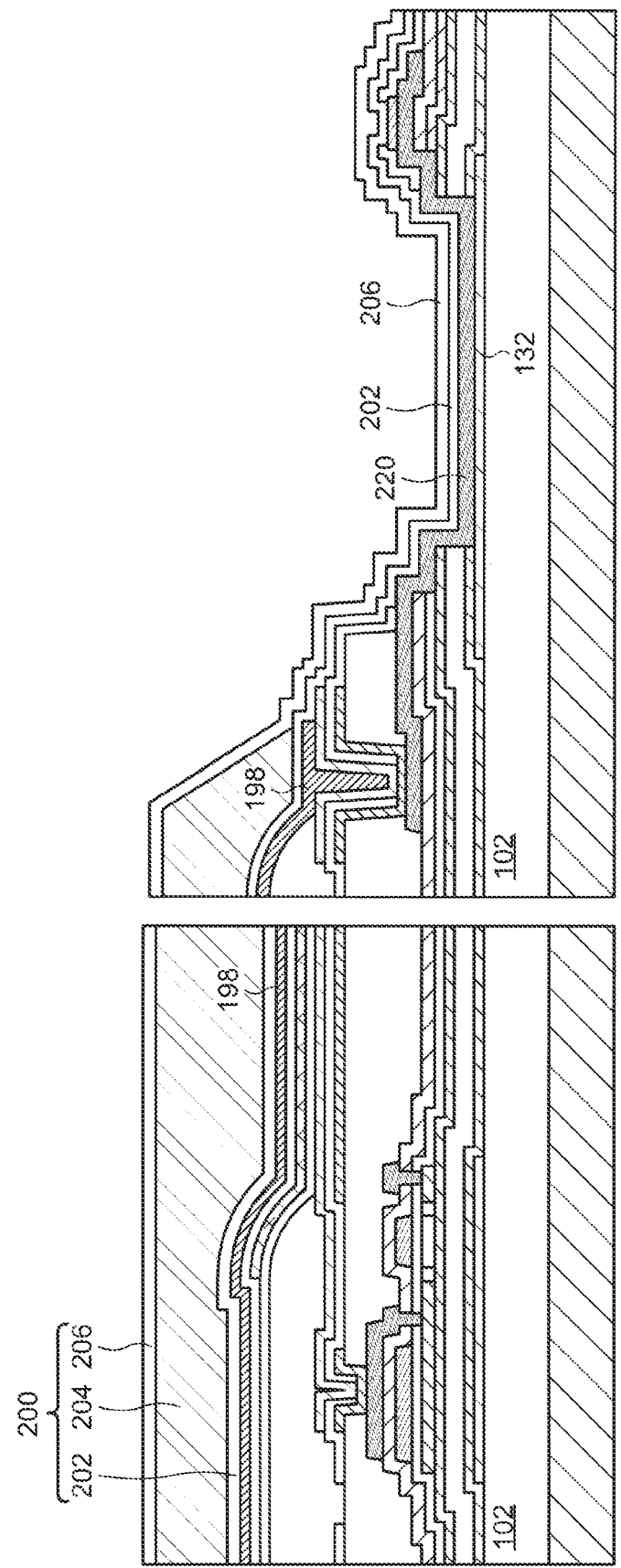
FIG. 15 is a schematic cross-sectional view showing a manufacturing method of a display device according to an embodiment.

After forming the opposing electrode 198, the passivation film 200 is fabricated. The passivation film 200 has a function to prevent impurities such as water from entering the light-emitting element 130 from the outside. As shown in FIG. 15, the passivation film 200 may have a structure in which the first layer 202, the second layer 204, and the third layer 206 are stacked. These layers may be respectively formed as a silicon-nitride film, an organic resin film, and a silicon-nitride film. A silicon-oxide film or an amorphous silicon film may be disposed between the first layer 202 and the second layer 204 or between the second layer 204 and the third layer 206 in order to improve adhesion.

Figure 16:
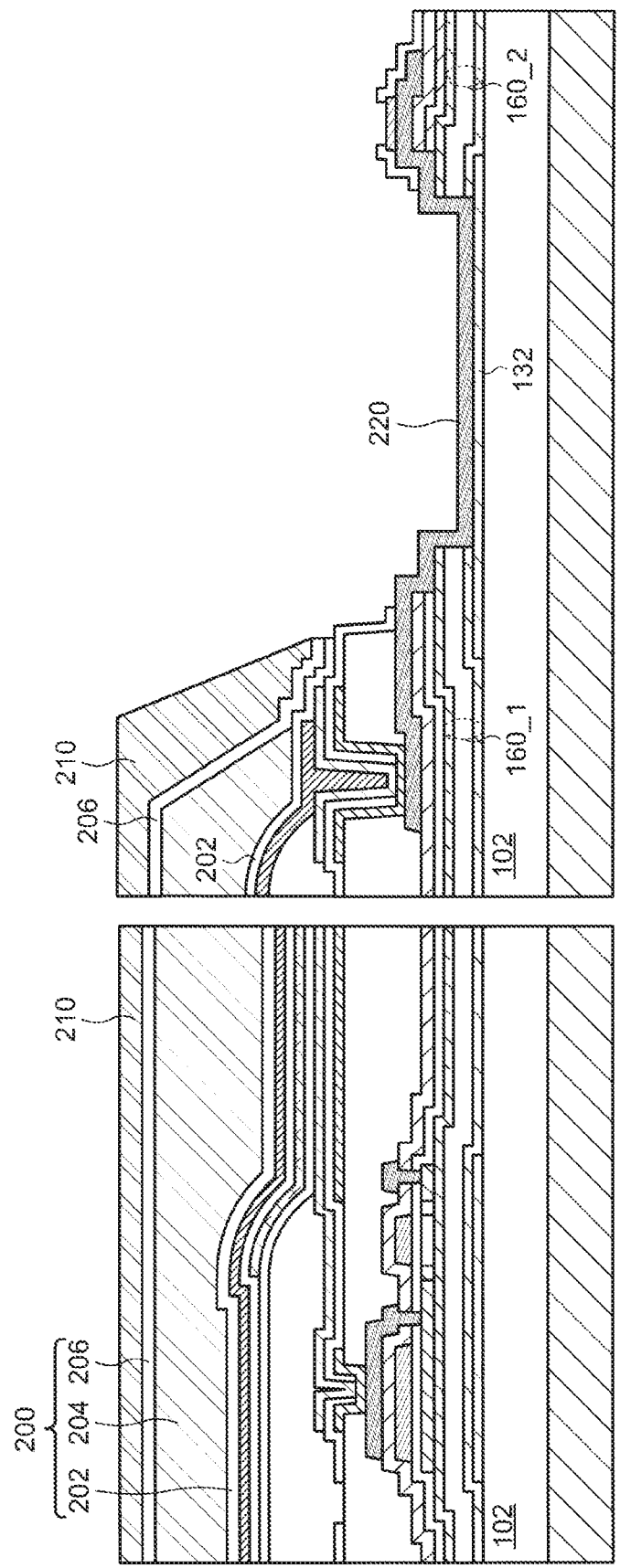
FIG. 16 is a schematic cross-sectional view showing a manufacturing method of a display device according to an embodiment.

At that time, the first layer 202 and the third layer 206 are formed so as to cover almost all of the surface of the substrate 102, while the second layer 204 is formed so as to cover the display region 106 and the contact electrode 222 but not to cover the terminals such as the power-source terminal 118 and the region between the first undercoat 160_1 and the second undercoat 160_2. After that, the resin film 210 is formed as shown in FIG. 16. The resin film 210 is prepared so as to selectively cover the display region 106 and contact electrode 222. Etching is conducted using this resin film 210 as a mask to remove the first layer 202 and the third layer 206 which are not covered by the resin film 210. With this process, the wiring 220 is exposed between the first undercoat 160_1 and the second undercoat 160_2, while the protection electrode 222c of the power-source terminal 118 is exposed, enabling the electrical connection with the FPC 114.

Although not illustrated, a supporting film 128 is provided over the resin film 210, light irradiation is performed through the supporting substrate 103 to reduce adhesion between the supporting substrate 103 and the substrate 102, and the supporting substrate 103 is peeled off. A supporting film 126 is disposed after peeling off the supporting substrate 103, thereby providing the display device 100 (FIG. 4, FIG. 5).

As described above, not only the undercoat 160 but also the insulating films such as the gate insulating film 164, the interlayer insulating film 170, and the planarization film 176 are removed between the first undercoat 160_1 and the second undercoat 160_2. Therefore, this portion has high flexibility and can be readily bent. Since these relatively hard and brittle insulating films are not provided in the portion to be bent, destruction of the seal and disconnection of the wirings caused by the damage to these insulating films can be prevented.

Furthermore, these insulating films are removed by etching as described above. In the case where the first conductive film 132 is not formed, the undercoat 160 is removed under the conditions resulting in a difference in the etching rate between the undercoat 160 and the substrate 102. However, it is not always easy to provide a sufficiently large difference in the etching rate between a polymer included in the substrate 102 and a silicon-containing inorganic compound included in the undercoat 160, and therefore, the substrate 102 tends to be over-etched during the etching of the undercoat 160. As a result, a step 230 is generated between the substrate 102 and the undercoat 160 as shown in FIG. 20A, which leads to disconnection (the portion surrounded by the dotted circle) of the wiring 220 formed thereover and causes a decrease in reliability and yield. Additionally, the further side etching of the substrate 102 results in a gap between the substrate 102 and the undercoat 160. When an etching residue of the wiring 220 is left in this gap, a short circuit between the wirings 220 is induced, resulting in generation of a display defect or deconstruction of the display device 100.

However, the display device 100 possesses the first conductive film 132 over the substrate 102. Since a large difference in the etching rate can be generated between the first conductive film 132 which is a metal film and the film including an inorganic compound containing silicon oxide or silicon nitride, the first conductive film 132 is negligibly etched and functions as an etching stopper during the removal of the undercoat 160 (FIG. 20B). Hence, it is possible to effectively suppress generation of a defect such as disconnection of the wirings 220 and a short circuit between the wirings 220 caused by the over-etching and the side etching of the substrate 102, which not only provides high reliability to a display device but also enables production of a display device at a high yield.

Second Embodiment

Figure 17A:
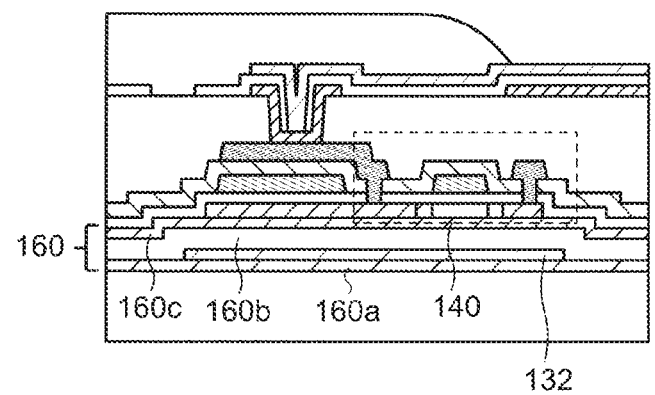
FIG. 17A is a schematic cross-sectional view of a display device according to an embodiment.
Figure 18A:
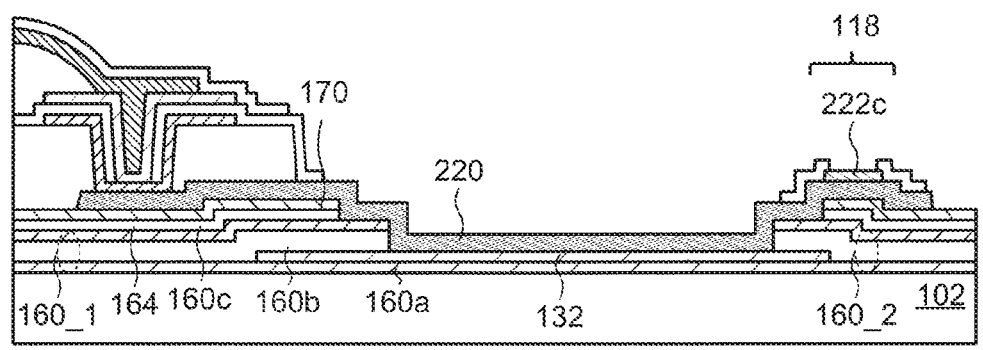
FIG. 18A is a schematic cross-sectional view of a display device according to an embodiment.

In the First Embodiment, a structure is demonstrated in which the first conductive film 132 and the second conductive film 134 are sandwiched by the substrate 102 and the undercoat 160. The positional relationship of the first conductive film 132 and the undercoat 160 is not limited thereto. For example, the undercoat 160 may be structured with a plurality of layers and the first conductive film 132 and the second conductive film 134 may be arranged between two layers selected from the plurality of layers. Specifically, the display device 100 may be configured so that the undercoat 160 possesses the first layer 160a, the second layer 160b, and the third layer 160c and the first conductive film 132 and the second conductive film 134 are positioned between the first layer 160a and the second layer 160b as shown in FIG. 17A and FIG. 18A. Therefore, the wiring 220 is in contact with the side surfaces of the second layer 160b, the third layer 160c, the gate insulating film 164, and the interlayer insulating film 170.

Figure 17B:
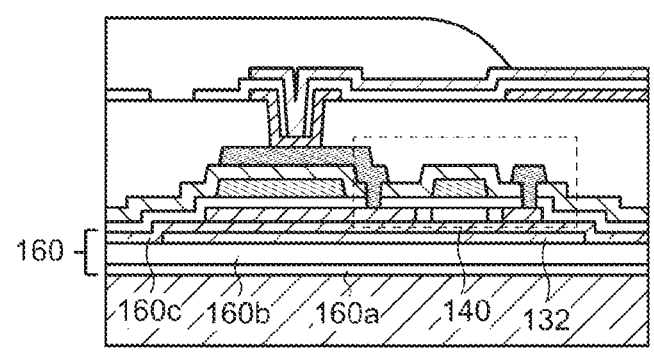
FIG. 17B is a schematic cross-sectional view of a display device according to an embodiment.
Figure 18B:
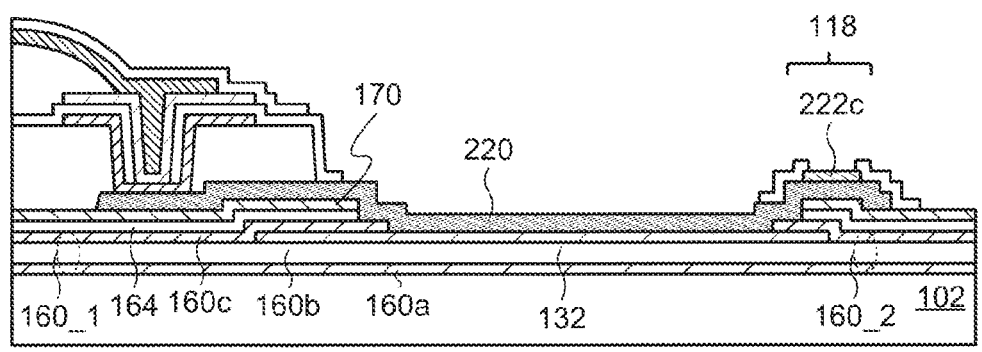
FIG. 18B is a schematic cross-sectional view of a display device according to an embodiment.

Alternatively, the display device 100 may be configured so that the first conductive film 132 and the second conductive film 134 are positioned between the second layer 160b and the third layer 160c as shown in FIG. 17B and FIG. 18B. In these structures, a part of the undercoat 160 is divided, and the first undercoat 160_1 and the second undercoat 160_2 share a part of the layers. The wiring 220 is in contact with the side surfaces of the third layer 160c, the gate insulating film 164, and the interlayer insulating film 170.

Figure 19A:
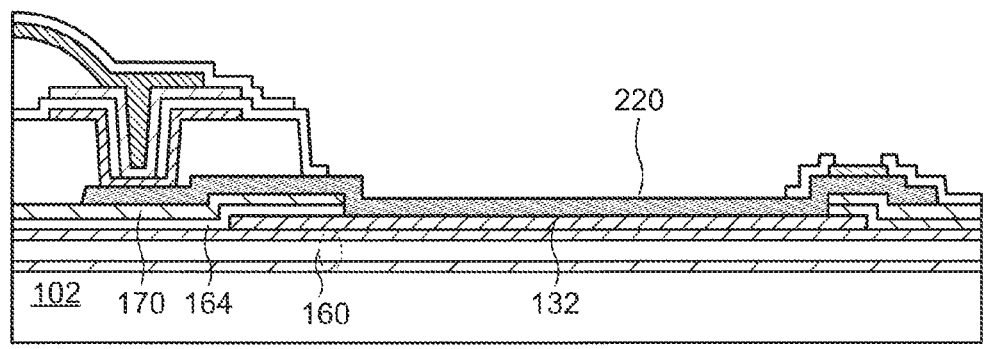
FIG. 19A is a schematic cross-sectional view of a display device according to an embodiment.

Alternatively, the first conductive film 132 may be formed over the undercoat 160. For example, the first conductive film 132 may be disposed between the undercoat 160 and the gate insulating film 164 as shown in FIG. 19A. In this case, the first conductive film 132 may exist in the same layer as the semiconductor film 162 and possess the same composition as the source region 162b and the drain region 162a. For instance, the first conductive film 132 includes a dopant imparting a n-type or p-type conductivity (phosphorus, nitrogen, boron, aluminum, or the like) and silicon or an oxide of a Group 13 element. In this case, although not illustrated, the second conductive film 134 is disposed as a metal film between the substrate 102 and the undercoat 160 or between the two layers selected from the plurality of layers in the undercoat 160 in the pixel 104.

Figure 19B:
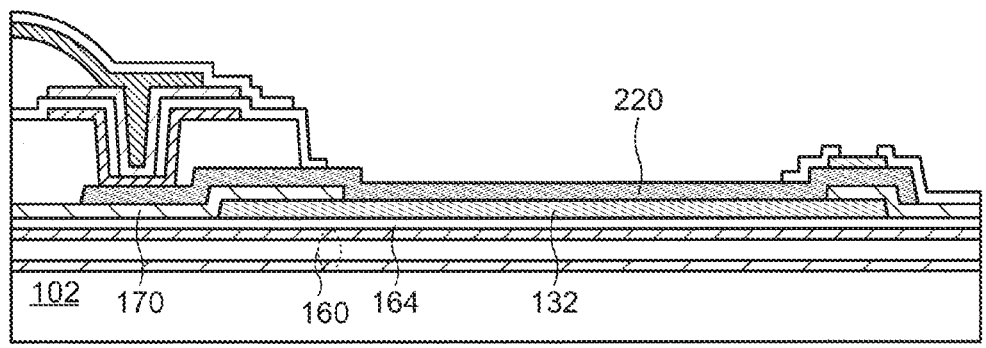
FIG. 19B is a schematic cross-sectional view of a display device according to an embodiment.

Alternatively, the first conductive film 132 may be arranged between the gate insulating film 164 and the interlayer insulating film 170 as shown in FIG. 19B. In this case, the first conductive film 132 may exist in the same layer as the gate electrode 166 and the capacitor electrode 168. In this case, although not illustrated, the second conductive film 134 is also disposed as a metal film between the substrate 102 and the undercoat 160 or between two layers selected from the plurality of layers of the undercoat 160 in the pixel 104. An explanation of other structures of the display device 100 described in the present embodiment is omitted because they are the same as those of the First Embodiment.

In the display device 100 having any of these structures, the step generated by removing the insulating films from the region where the first conductive film 132 is arranged can be reduced, which leads to reduction of stress applied to the wiring 220 when the display device 100 is bent. Hence, disconnection of the wiring 220 scarcely occurs, and high reliability can be provided to the display device.

The aforementioned modes described as the embodiments of the present invention can be implemented by appropriately combining with each other as long as no contradiction is caused. Furthermore, any mode which is realized by persons ordinarily skilled in the art through the appropriate addition, deletion, or design change of elements or through the addition, deletion, or condition change of a process is included in the scope of the present invention as long as they possess the concept of the present invention.

In the specification, although the cases of the organic EL display device are exemplified, the embodiments can be applied to any kind of display devices of the flat panel type such as other self-emission type display devices, liquid crystal display devices, and electronic paper type display device having electrophoretic elements and the like. In addition, it is apparent that the size of the display device is not limited, and the embodiment can be applied to display devices having any size from medium to large.

It is properly understood that another effect different from that provided by the modes of the aforementioned embodiments is achieved by the present invention if the effect is obvious from the description in the specification or readily conceived by persons ordinarily skilled in the art.

What is claimed is:

1. A display device comprising:
a first conductive film over and in contact with a substrate;
a first undercoat and a second undercoat over the first conductive film, the first undercoat and the second undercoat being in contact with the substrate and the first conductive film;
a pixel over the first undercoat, the pixel comprising a transistor;
a wiring over the first undercoat, the first conductive film, and the second undercoat, the wiring being in contact with the first conductive film between the first undercoat and the second undercoat;
a terminal over the second undercoat, the terminal being electrically connected to the wiring; and
a second conductive film overlapping with the transistor, the second conductive film being arranged between the substrate and the first undercoat,
wherein the first undercoat and the second undercoat are spaced from each other over the first conductive film and each cover a part of the first conductive film.

2. The display device according to claim 1,
wherein the wiring is in contact with a side surface of the first undercoat and a side surface of the second undercoat.

3. The display device according to claim 1,
wherein the transistor includes:
a semiconductor film;
a gate electrode;
a gate insulating film between the semiconductor film and the gate electrode; and
an interlayer insulating film over the semiconductor film, the gate electrode, and the gate insulating film.

4. The display device according to claim 3,
wherein the wiring is in contact with a side surface of the gate insulating film and a side surface of the interlayer insulating film over the first undercoat and the second undercoat.

5. The display device according to claim 3,
wherein the second conductive film is electrically connected to the gate electrode.

6. The display device according to claim 1,
wherein the first conductive film and the second conductive film are in the same layer.

7. The display device according to claim 1,
wherein a width of the first conductive film is the same as a width of the wiring between the first undercoat and the second undercoat.

8. The display device according to claim 1,
wherein the substrate has a bent portion between the first undercoat and the second undercoat, and
the display device has a three-dimensional structure in which the first undercoat and the second undercoat overlap with each other in a plane view.

9. A display device comprising:
an undercoat over and in contact with a substrate, the undercoat comprising a first layer, a second layer over the first layer, and a third layer over the second layer;
a first conductive film between the first layer and the second layer;
a pixel and a terminal over the third layer, the pixel including a transistor;
a wiring over the third layer, the wiring electrically connecting the pixel to the terminal; and
a second conductive film overlapping with the transistor, the second conductive film being arranged between the first layer and the second layer,
wherein the second layer and the third layer are each divided over the first conductive film so that the first conductive film is exposed,
the wiring is in contact with the first conductive film in a region where the first conductive film is exposed from the second layer and the third layer, and
the region is located between the pixel and the terminal.

10. The display device according to claim 9,
wherein the wiring is in contact with a side surface of the second layer and a side surface of the third layer.

11. The display device according to claim 9,
wherein the transistor includes:
a semiconductor film;
a gate electrode;
a gate insulating film between the semiconductor film and the gate electrode; and
an interlayer insulating film over the semiconductor film, the gate electrode, and the gate insulating film.

12. The display device according to claim 11,
wherein the wiring is in contact with a side surface of the gate insulating film and a side surface of the interlayer insulating film.

13. The display device according to claim 11,
wherein the second conductive film is electrically connected to the gate electrode.

14. The display device according to claim 9,
wherein the first conductive film and the second conductive film are in the same layer.

15. The display device according to claim 9,
wherein a width of the first conductive film is the same as a width of the wiring.

16. The display device according to claim 9,
wherein the substrate has a bent portion between the terminal and the pixel, and
the display device has a three-dimensional structure in which the terminal and the pixel overlap with each other in a plane view.

17. A display device comprising:
an undercoat over and in contact with a substrate;
a pixel over the undercoat, the pixel comprising a transistor including a semiconductor film, a gate electrode, a gate insulating film between the semiconductor film and the gate electrode, and an interlayer insulating film over the semiconductor film, the gate electrode, and the gate insulating film;
a first conductive film over and in contact with the undercoat, the first conductive film existing in the same layer as the semiconductor film;
a wiring over the interlayer insulating film; and
a terminal over the interlayer insulating film, the terminal being electrically connected to the wiring,
wherein the gate insulating film and the interlayer insulating film are each divided over the first conductive film so that the first conductive film is exposed,
the wiring is in contact with the first conductive film in a region where the first conductive film is exposed from the gate insulating film and the interlayer insulating film, and
the region is located between the pixel and the terminal.

18. A display device comprising:
an undercoat over and in contact with a substrate;
a pixel over the undercoat, the pixel comprising a transistor including a semiconductor film, a gate electrode, a gate insulating film between the semiconductor film and the gate electrode, and an interlayer insulating film over the semiconductor film, the gate electrode, and the gate insulating film;

a first conductive film over and in contact with the gate insulating film, the first conductive film existing in the same layer as the gate electrode;

a wiring over the interlayer insulating film; and a terminal over the interlayer insulating film, the terminal being electrically connected to the wiring, wherein the interlayer insulating film is divided over the first conductive film so that the first conductive film is exposed, the wiring is in contact with the first conductive film in a region where the first conductive film is exposed from the interlayer insulating film, and the region is located between the pixel and the terminal.

* * * * *